(12) United States Patent
Ikeda et al.

(10) Patent No.: US 11,401,746 B2
(45) Date of Patent: Aug. 2, 2022

(54) SENSOR UNIT MANUFACTURING METHOD

(71) Applicant: MITSUBA Corporation, Gunma (JP)

(72) Inventors: Takayuki Ikeda, Gunma (JP); Tsuyoshi Maruyama, Gunma (JP); Akihiro Iino, Gunma (JP); Yasuhiro Tsukahara, Gunma (JP); Yohei Inagaki, Gunma (JP); Takao Fueki, Gunma (JP)

(73) Assignee: MITSUBA Corporation, Gunma (JP)

( * ) Notice: Subject to any disclaimer, the term of this patent is extended or adjusted under 35 U.S.C. 154(b) by 51 days.

(21) Appl. No.: 17/263,882

(22) PCT Filed: May 15, 2019

(86) PCT No.: PCT/JP2019/019259
§ 371 (c)(1),
(2) Date: Jan. 27, 2021

(87) PCT Pub. No.: WO2020/039665
PCT Pub. Date: Feb. 27, 2020

(65) Prior Publication Data
US 2021/0324671 A1   Oct. 21, 2021

(30) Foreign Application Priority Data

Aug. 23, 2018  (JP) .............................. JP2018-155929

(51) Int. Cl.
*E05F 15/46* (2015.01)
*B60J 5/10* (2006.01)
*H03K 17/96* (2006.01)

(52) U.S. Cl.
CPC ............... *E05F 15/46* (2015.01); *B60J 5/107* (2013.01); *H03K 17/962* (2013.01); *E05Y 2900/546* (2013.01); *H03K 2017/9602* (2013.01); *H03K 2217/96078* (2013.01)

(58) Field of Classification Search
CPC . E05F 15/46; B60J 5/107; B60J 10/80; H03K 17/962; H03K 2017/9602;
(Continued)

(56) References Cited

U.S. PATENT DOCUMENTS

| 6,081,088 A * | 6/2000 | Ishihara | E05F 15/44 |
| | | | 318/467 |
| 2002/0078758 A1* | 6/2002 | Suzuki | E05F 15/44 |
| | | | 73/753 |

(Continued)

FOREIGN PATENT DOCUMENTS

| GB | 2314459 A | * | 12/1997 | ............ | H01B 7/104 |
| JP | H1029425 A | * | 2/1998 | ............ | H01H 3/142 |

(Continued)

OTHER PUBLICATIONS

"International Search Report (Form PCT/ISA/210) of PCT/JP2019/019259," dated Aug. 6, 2019, with English translation thereof, pp. 1-3.

(Continued)

*Primary Examiner* — Daniel R Miller
(74) *Attorney, Agent, or Firm* — JCIPRNET

(57) ABSTRACT

A sensor unit manufacturing method includes: a core metal insertion process of inserting a core metal member having a length dimension smaller than a length dimension of a core metal accommodation portion into a predetermined location (a section of a curving portion) extending along a longitudinal direction of the core metal accommodation portion; and a bending process of bending the section (the section of the curving portion) of a fixation base portion, into which the core metal member is inserted, following a curved shape of a sensor bracket.

14 Claims, 19 Drawing Sheets

(58) Field of Classification Search
CPC ....... H03K 2217/96078; H03K 17/955; H03K 2217/96023; E05Y 2900/546; G01L 1/20
See application file for complete search history.

(56) References Cited

U.S. PATENT DOCUMENTS

| | | | |
|---|---|---|---|
| 2002/0113602 A1* | 8/2002 | Ishihara | B60J 10/00 324/658 |
| 2007/0113481 A1* | 5/2007 | Kato | E05F 15/46 49/27 |
| 2009/0009325 A1* | 1/2009 | Hoshina | E05F 15/42 361/600 |
| 2011/0016513 A1 | 1/2011 | Bailey, Jr. | |
| 2011/0232391 A1* | 9/2011 | Ruby, III | E05F 15/44 73/768 |

FOREIGN PATENT DOCUMENTS

| | | | |
|---|---|---|---|
| JP | 2003106048 | | 4/2003 |
| JP | 2003106048 A * | | 4/2003 |
| JP | 2004340796 | | 12/2004 |
| JP | 2006080366 | | 3/2006 |
| JP | 2017203661 | | 11/2017 |
| WO | WO-2006101109 A1 * | 9/2006 | E05F 15/46 |

OTHER PUBLICATIONS

"International Preliminary Report of Patentability (Form PCT/IB/373) of PCT/JP2019/019259", with English translation thereof, dated Aug. 6, 2019, pp. 1-15.

* cited by examiner

SENSOR UNIT MANUFACTURING METHOD

CROSS-REFERENCE TO RELATED APPLICATION

This application is a 371 application of the International PCT application serial no. PCT/JP2019/019259, filed on May 15, 2019, which claims the priority benefit of Japan Patent Application No. 2018-155929, filed on Aug. 23, 2018. The entirety of each of the abovementioned patent applications is hereby incorporated by reference herein and made a part of this specification.

BACKGROUND

Technical Field

The present invention relates to a sensor unit manufacturing method, which manufactures a sensor unit including a cable-shaped sensor main body which detects proximity or contact of a block and a sensor holder which holds the sensor main body and is elastically deformed by application of an external force.

Related Art

Conventionally, a vehicle such as an automobile and the like is sometimes provided with a tail gate which is opened and closed by an automatic opening/closing device. The automatic opening/closing device is driven by an operation of an operation switch according to the intention of an operator, but it can also be driven by other conditions. Specifically, in the automatic opening/closing device, a sensor unit which detects that a block is clamped between the tail gate and an opening portion is arranged.

The sensor unit is fixed to the tail gate and detects that the block comes into contact with the tail gate being driven to close. Then, based on input of a detection signal from the sensor unit, the automatic opening/closing device performs open driving of the tail gate being driven to close or urgently stops the tail gate being driven to close on the spot, regardless of the operation of the operation switch.

An example of this kind of sensor unit is described in Patent literature 1. The touch sensor unit described in Patent literature 1 has a sensor holder which is made of an insulating rubber and which includes a sensor portion configured to hold a cable-shaped sensor main body and a base portion configured to fix the sensor portion to a tail gate.

Besides, a hard resin portion is arranged radially inside a curving portion arranged in the base portion, and thereby the base portion can be held in a curved state so as to prevent a double-sided tape from being peeled off by a restoring force attempting to return the base portion straight. In addition, instead of the hard resin portion, a core metal is molded in a section of the base portion, which corresponds to the curving portion, and the molded core metal is curved, thereby making it possible to hold the base portion in a curved state.

LITERATURE OF RELATED ART

Patent Literature

Patent literature 1: Japanese Patent Laid-Open No. 2017-203661

SUMMARY

Problems to be Solved

However, in the technique described in Patent literature 1, because a hard resin portion having a hardness higher than the hardness of the base portion is arranged, when the touch sensor unit is viewed from the outside, a boundary section between the base portion and the hard resin portion becomes conspicuous, and a problem of a deterioration of appearance may occur.

In addition, when a core metal is molded in a section of the base portion which corresponds to the curving portion, after the base portion is injection-molded and cured, the section where the core metal is arranged swells due to shrinkage of the insulating rubber material, and accordingly the problem of the deterioration of appearance may also occur.

Furthermore, when the touch sensor unit is fixed to the tail gate, in a case that positional deviation of the curving portion and the like are generated, the position of the curving portion cannot be adjusted. That is, the position of the hard resin portion or the position of the core metal cannot be shifted in a longitudinal direction of the base portion. Therefore, not only yield deteriorates, but it is also difficult to make the sensor unit common with other vehicle types.

A purpose of the present invention is to provide a sensor unit manufacturing method which is capable of not only improving an appearance of a curving portion but also adjusting the curving portion in a longitudinal direction of a sensor holder, leading to increase in yield and improvement in versatility.

Means to Solve Problems

In an aspect of the present invention, a sensor unit manufacturing method which manufactures a sensor unit including: a sensor main body which is cable-shaped and detects proximity or contact of a block; and a sensor holder which holds the sensor main body and is elastically deformed by application of an external force. The sensor holder includes: a sensor accommodation portion in which the sensor main body is accommodated inside; a fixation base portion which is integrally arranged with the sensor accommodation portion in order to fix the sensor accommodation portion to a fixation object; and a core metal accommodation portion which is arranged in the fixation base portion and in which a core metal member is accommodated inside. The sensor unit manufacturing method includes: a core metal insertion process of inserting the core metal member having a length dimension smaller than a length dimension of the core metal accommodation portion into a predetermined location extending along a longitudinal direction of the core metal accommodation portion; and a bending process of bending the section of the fixation base portion, into which the core metal member is inserted, following a curved shape of the fixation object.

In another aspect of the present invention, a sensor holder fixation process of fixing the sensor holder which is bent through the bending process to the fixation object is performed after the bending process.

In another aspect of the present invention, the core metal member is inserted into the core metal accommodation portion from an end portion of the fixation base portion in the core metal insertion process.

In another aspect of the present invention, a terminal processing process of forming a terminal portion at the end portion of the fixation base portion is performed between the core metal insertion process and the bending process.

In another aspect of the present invention, a cap mounting process of mounting a cap member on an end portion of the core metal accommodation portion is performed between the core metal insertion process and the terminal processing process.

In another aspect of the present invention, a fixation base portion cutting process of cutting a predetermined location extending along the longitudinal direction of the fixation base portion in a direction intersecting the longitudinal direction of the fixation base portion is performed before the core metal insertion process, and the core metal member is inserted into the core metal accommodation portion from a cut location of the fixation base portion in the core metal insertion process thereafter.

In another aspect of the present invention, a terminal processing process of forming a terminal portion at the end portion of the fixation base portion is performed before the fixation base portion cutting process.

In another aspect of the present invention, a cap mounting process for mounting a cap member on an end portion of the core metal accommodation portion is performed before the terminal processing process.

Effect

According to the present invention, a sensor unit manufacturing method includes a core metal insertion process of inserting a core metal member having a length dimension smaller than a length dimension of a core metal accommodation portion into a predetermined location extending along a longitudinal direction of the core metal accommodation portion, and a bending process of bending the section of the fixation base portion, into which the core metal member is inserted, following a curved shape of the fixation object.

Accordingly, an appearance of the section (a curving portion) of the fixation base portion into which the core metal member is inserted can be improved. In addition, by increasing the length dimension of the core metal member to be accommodated in the core metal accommodation portion, the position where the curving portion is formed can be shifted by a predetermined amount in the longitudinal direction of the fixation base portion. Therefore, the position of the curving portion can be adjusted, and further yield and versatility can be improved.

DESCRIPTION OF THE EMBODIMENTS

Embodiment 1 of the present invention is described below in detail with reference to drawings.

Figure 1:
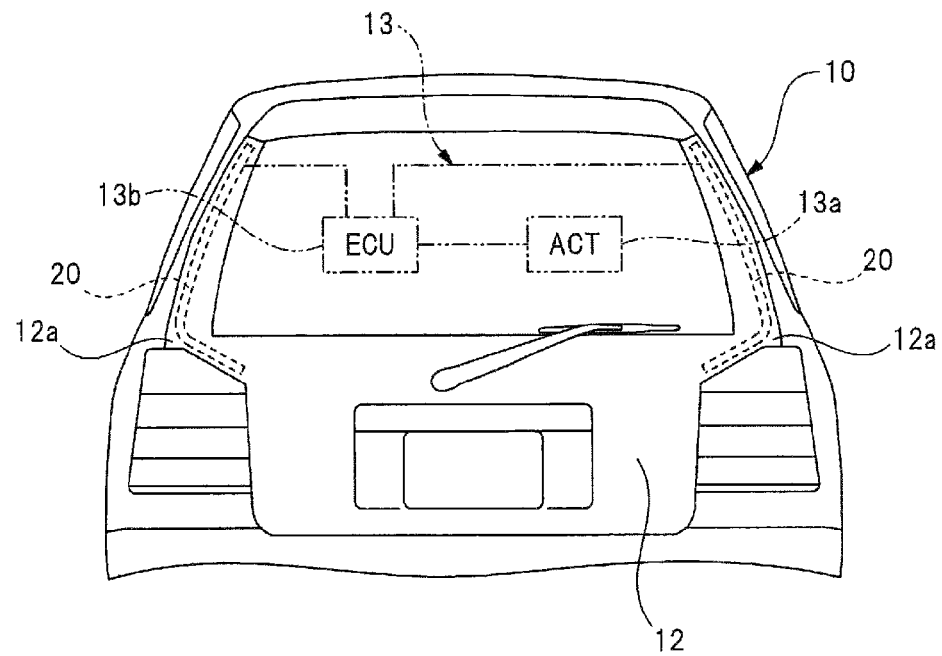
FIG. 1 is a front view showing a tail gate of a vehicle.
Figure 2:
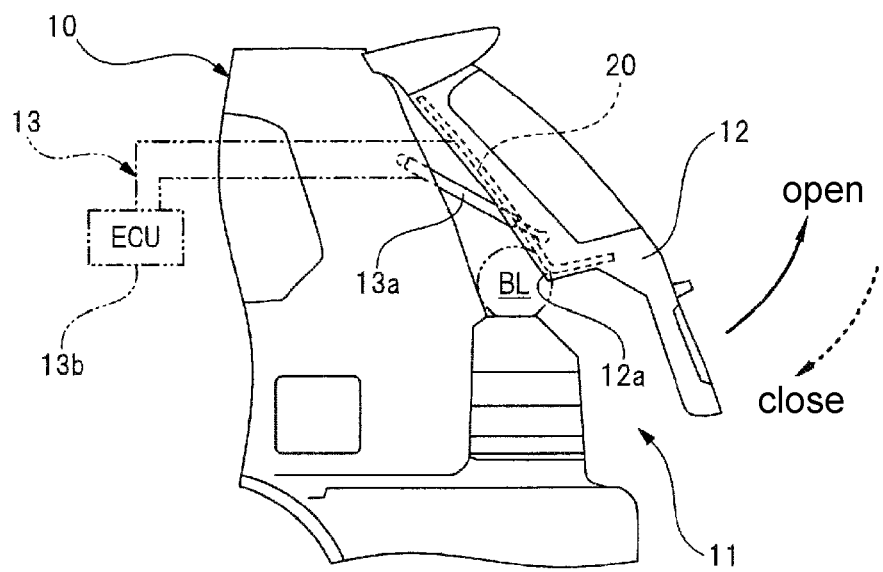
FIG. 2 is a side view of the tail gate of FIG. 1 when viewed from a lateral side.
Figure 3:
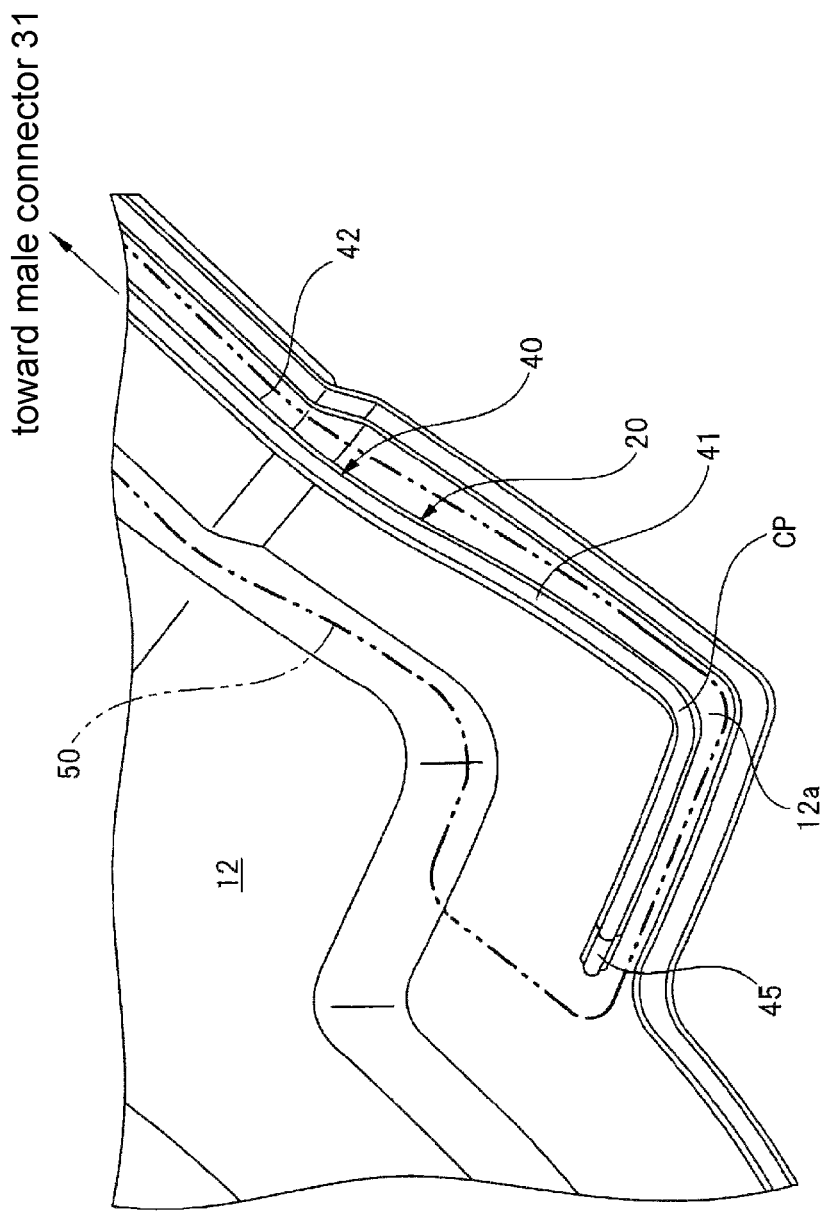
FIG. 3 is a perspective view showing a mounting state of a sensor unit on the tail gate.
Figure 4:
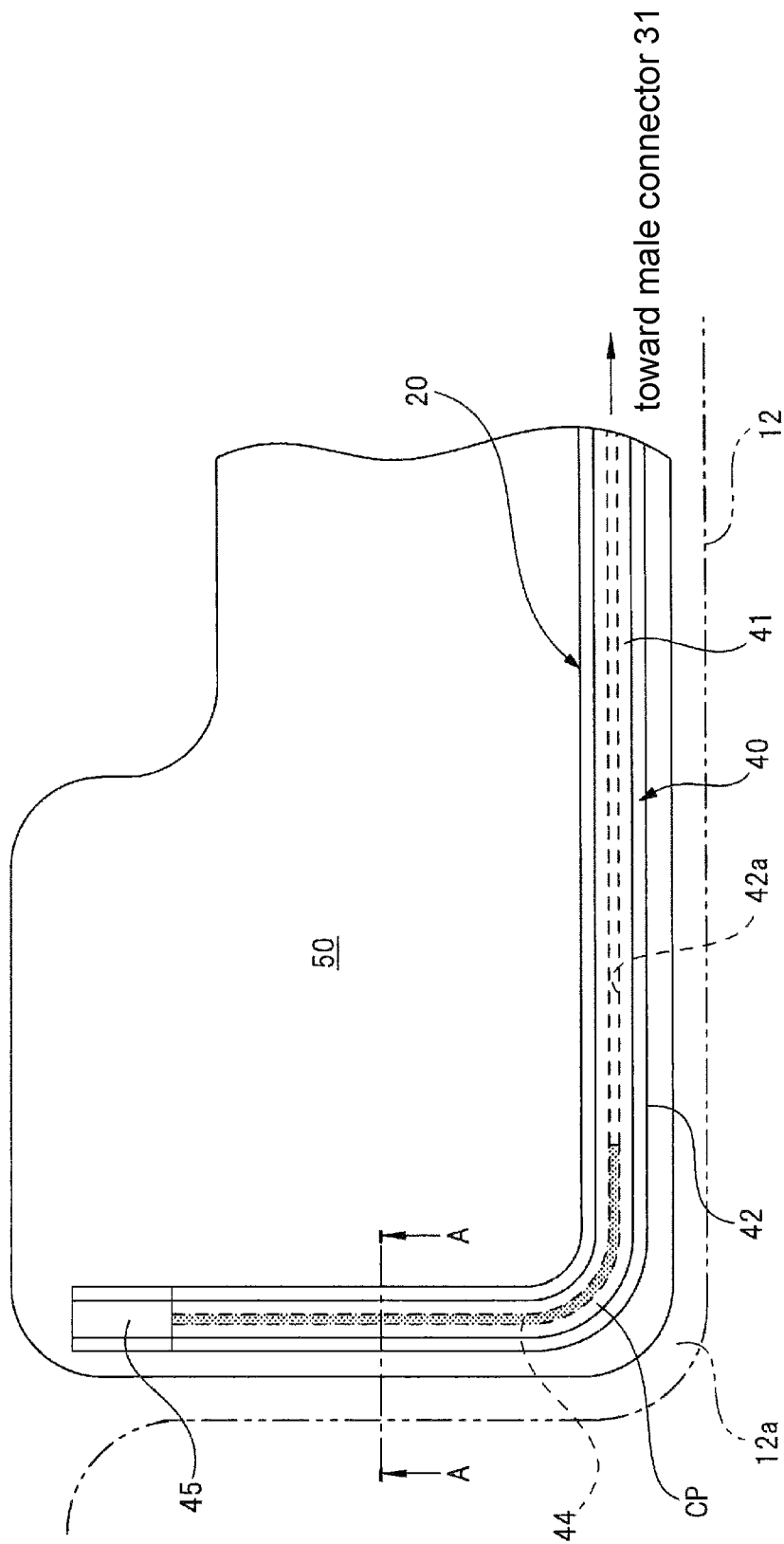
FIG. 4 is a front view of the sensor unit of FIG. 3.
Figure 5:
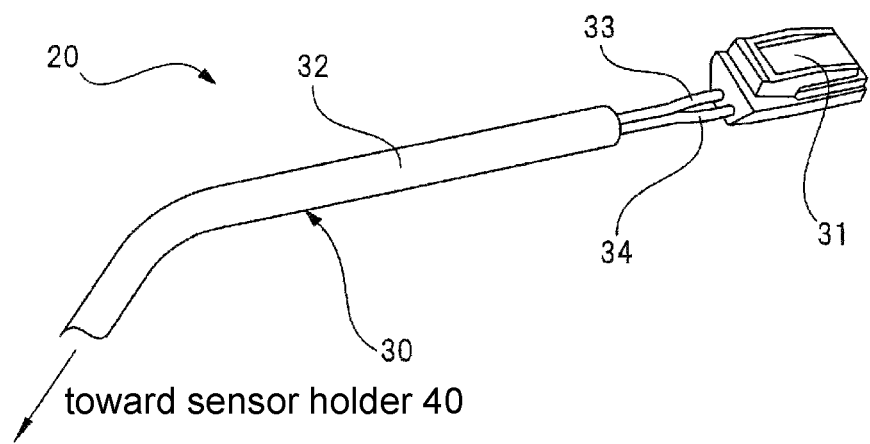
FIG. 5 is a perspective view showing a base end side of the sensor unit.
Figure 6:
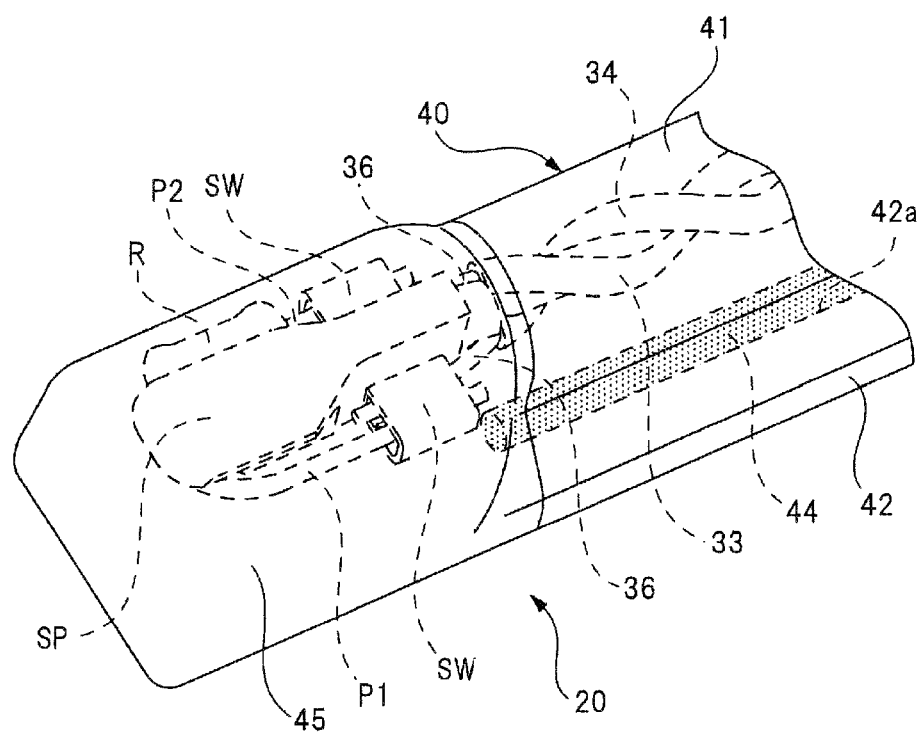
FIG. 6 is a perspective view showing a front end side of the sensor unit.
Figure 7:
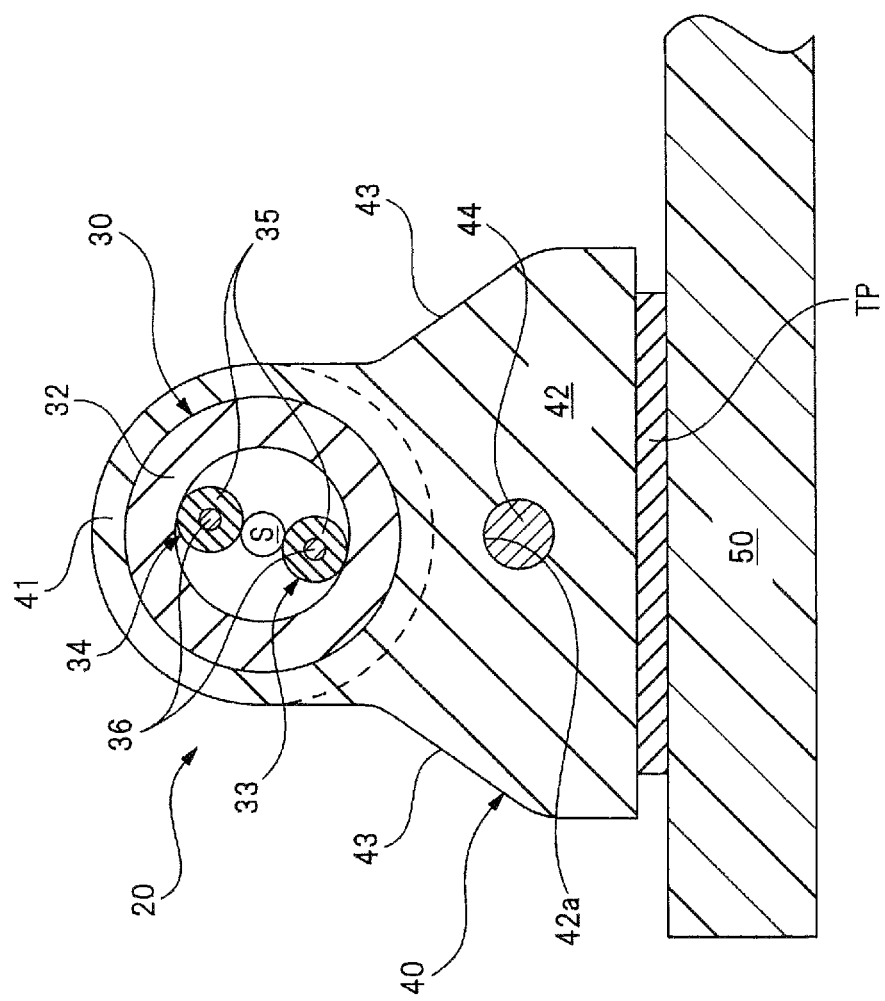
FIG. 7 is a cross-sectional view along line A-A of FIG. 4.
Figure 8:
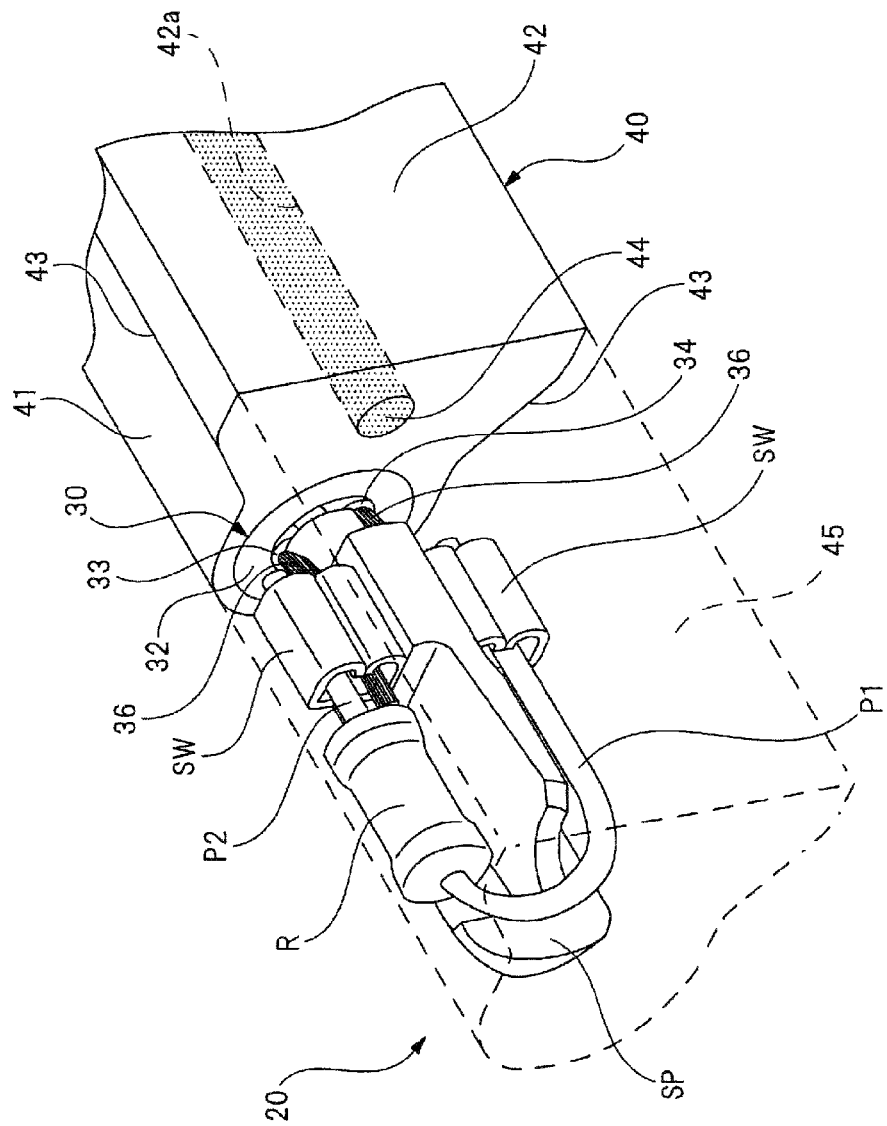
FIG. 8 is a perspective view illustrating an internal structure of a molded resin portion.

FIG. 1 is a front view showing a tail gate of a vehicle, FIG. 2 is a side view of the tail gate of FIG. 1 when viewed from a lateral side, FIG. 3 is a perspective view showing a mounting state of a sensor unit on the tail gate, FIG. 4 is a front view of the sensor unit of FIG. 3, FIG. 5 is a perspective view showing a base end side of the sensor unit, FIG. 6 is a perspective view showing a front end side of the sensor unit, FIG. 7 is a cross-sectional view along line A-A of FIG. 4, and FIG. 8 is a perspective view illustrating an internal structure of a molded resin portion.

A vehicle 10 shown in FIG. 1 and FIG. 2 is a so-called hatchback type vehicle, and an opening portion 11 from which large luggage can be taken in and out of a vehicle interior is formed on a rear side of the vehicle 10. The opening portion 11 is opened and closed as shown by a solid line arrow and a broken line arrow in FIG. 2 by a tail gate (an opening and closing body) 12 which pivots around a hinge (not shown) arranged on a rear side of a ceiling portion of the vehicle 10.

In addition, a power tail gate device (an automatic opening/closing device) 13 is mounted on the vehicle 10 according to the embodiment. The power tail gate device 13 includes: an actuator (ACT) with speed reduction machine 13a which makes the tail gate 12 open and close, a controller (ECU) 13b which controls the actuator 13a based on an operation signal of an operation switch (not shown), and a pair of sensor units 20 which detects contact of a block BL.

As shown in FIG. 1, the sensor units 20 are respectively mounted on two sides (a left side and a right side in the diagram) in a vehicle width direction of the tail gate 12. More specifically, the pair of sensor units 20 is arranged following a curved shape of edge portions 12a on the two sides in the vehicle width direction of the tail gate 12. That is, the pair of sensor units 20 is in a curved state following the curved shape of the edge portions 12a and is respectively fixed to the tail gate 12 under the curved state.

Accordingly, when the block BL comes into contact with the sensor unit 20 between the opening portion 11 and the tail gate 12, a sensor main body 30 (see FIG. 7) forming the sensor unit 20 is immediately elastically deformed.

Besides, the pair of sensor units 20 is electrically connected to the controller 13b respectively, and a detection signal which is generated when the sensor main body 30 is elastically deformed is input to the controller 13b. Based on the input of the detection signal from the sensor main body 30, the controller 13b performs open driving (inversion driving) of the tail gate 12 being driven to close or stops the tail gate 12 being driven to close on the spot (stops in emergency), regardless of the operation of the operation switch. Accordingly, the block BL is prevented from being clamped.

Here, as shown in FIG. 6 and FIG. 7, a pair of electrodes 33 and 34 is arranged in the sensor main body 30, and a resistor R is electrically connected to the front end side of the sensor main body 30 (a left side in FIG. 6). Accordingly, when the sensor main body 30 is in a state not being elastically deformed, the pair of electrodes 33 and 34 is not in contact with each other, and a resistance value of the resistor R is input to the controller 13b. That is, when the resistance value of the resistor R is input, the controller 13b determines that there is no clamping of the block BL, and continuously executes the close driving of the tail gate 12.

In contrast, when the block BL comes into contact with the sensor unit 20 and the sensor main body 30 is elastically deformed, the pair of electrodes 33 and 34 is brought into contact with each other and short-circuited. Then, the resistance value (which is infinite) that does not pass through the resistor R is input to the controller 13b. Accordingly, the controller 13b detects a change in the resistance value, and takes the change of the resistance value as a trigger to perform open driving of the tail gate 12 or to execute the control that stops the tail gate 12 on the spot.

As shown in FIGS. 3 to 8, the sensor unit 20 is formed in a long cable shape. Besides, the sensor unit 20 is fixed to the tail gate 12 by a double-sided tape (an adhesive tape) TP via a sensor bracket 50. Moreover, in FIG. 3, the sensor bracket 50 is schematically shown by a thick two-dot chain line (an imaginary line).

The sensor main body 30 (see FIG. 7), which forms the sensor unit 20 and is elastically deformed by the contact of the block BL (see FIG. 2), is arranged so as to follow the edge portion 12a of the tail gate 12. Accordingly, even if the tail gate 12 has a complicated shape, the block BL can be reliably prevented from being clamped.

Here, the sensor bracket 50 configures a fixation object in the present invention. Besides, the sensor bracket 50 on which the sensor unit 20 is mounted is firmly fixed to the tail gate 12 by a plurality of fixing bolts (not shown) without looseness. Moreover, the sensor bracket 50 is formed in a plate shape by a hard plastic or the like.

The sensor unit 20 is configured by the cable-shaped sensor main body 30 arranged over the entire longitudinal direction of the sensor unit 20, and a sensor holder 40 which holds the sensor main body 30. In addition, as shown in FIG. 5, base end sides of the pair of electrodes 33 and 34 are arranged on the base end side of the sensor main body 30 (on a right side of FIG. 5), and a male connector 31 mounted on a female connector (not shown) of the controller 13b (see FIG. 1 and FIG. 2) is arranged on the base end sections of the electrodes 33 and 34.

As shown in FIG. 7, the sensor main body 30 includes a hollow insulating tube 32 made of a flexible insulating rubber material and the like. The insulating tube 32 is elastically deformed by application of an external force, and on an inner side in the radial direction (an interior) of the insulating tube 32, the pair of electrodes 33 and 34 is held in a spiral shape in a mutually non-contact state. Each of the electrodes 33 and 34 includes a conductive tube 35 made of a flexible conductive rubber and the like, and a conductive wire 36 formed by bundling a plurality of copper wires is arranged inside the conductive tube 35.

Besides, an inner diameter dimension of the insulating tube 32 is about three times as large as a diameter dimension of the pair of electrodes 33 and 34. In other words, a fine gap S in which about one electrode can be inserted is formed between the pair of electrodes 33 and 34 facing each other with an axial center of the insulating tube 32 as a center.

In this way, the pair of electrodes 33 and 34 is oppositely disposed in the radial direction and is spirally fixed in the longitudinal direction inside the insulating tube 32, and the fine gap S in which about one electrode can be inserted is secured between the pair of electrodes 33 and 34. Accordingly, no matter which section of the sensor main body 30 is elastically deformed by the block BL (see FIG. 2), the pair of electrodes 33 and 34 comes into contact with each other and is short-circuited with substantially the same condition (the external force).

Here, in the sensor unit 20 used for the tail gate 12, the diameter dimension of the insulating tube 32 is about 5.0 mm. Therefore, in consideration of handling of the sensor unit 20 with respect to the tail gate 12 and detection sensitivity, it is desirable to spirally arrange a pair of electrodes 33 and 34 having a diameter dimension of about 1.0 mm inside the insulating tube 32.

For example, in the embodiment, the pair of electrodes 33 and 34 is not short-circuited with each other even when the sensor main body 30 is wound around a small-diameter column having a radius of 4.0 mm. In contrast, as a comparative example, for example, in a case that four same electrodes are arranged in parallel inside the same insulating tube, each electrode is short-circuited even when the sensor main body is wound around a large-diameter column having a radius of 7.5 mm.

In this way, in the embodiment, that is, in the case that the pair of electrodes 33 and 34 is spirally arranged inside the insulating tube 32, it is possible to sufficiently correspond to the tail gate 12 having the edge portion 12a curved at approximately 90 degrees (approximately right angle).

As shown in FIG. 7 and FIG. 8, the sensor holder 40 includes: a sensor accommodation portion 41 which is hollow and formed in a long cable shape by extruding and molding a flexible insulating rubber material and the like, and accommodates the sensor main body 30 therein; and a fixation base portion 42 which is fixed to the sensor bracket 50. Moreover, in FIG. 7, a broken line is drawn at a boundary section between the sensor accommodation portion 41 and the fixation base portion 42.

A cross-sectional shape of the sensor accommodation portion 41 along a direction intersecting the longitudinal direction of the sensor holder 40, that is, a lateral direction of the sensor holder 40, is formed in a substantially circular shape. In addition, a wall thickness of the sensor accommodation portion 41 is thinner than a wall thickness of the insulating tube 32. That is, the sensor accommodation portion 41 can also be easily elastically deformed by application of an external force (the contact of the block BL).

Therefore, the pair of electrodes 33 and 34 held in the insulating tube 32 is easily brought into contact (short-circuited) with each other by the elastic deformation of the sensor accommodation portion 41 and the insulating tube 32, and thus sufficient detection performance (sensitivity) of the sensor main body 30 is secured.

The fixation base portion 42 is integrally arranged with the sensor accommodation portion 41 along the longitudinal direction of the sensor accommodation portion 41. The fixation base portion 42 is configured to fix the sensor accommodation portion 41 to the sensor bracket 50, and the sensor accommodation portion 41 and the sensor main body 30 are fixed to the sensor bracket 50 via the fixation base portion 42.

In addition, the cross-sectional shape of the fixation base portion 42 along the lateral direction of the sensor holder 40 is formed into a substantially trapezoidal shape, and inclined surfaces 43 are respectively formed on two side surfaces in the lateral direction. These inclined surfaces 43 are arranged so as to face each other from a width direction of the sensor holder 40 (a left-right direction in FIG. 7). Furthermore, the pair of inclined surfaces 43 is inclined so as to increase the width dimension of the fixation base portion 42 from a side of the sensor accommodation portion 41 toward a side of the sensor bracket 50.

Here, the pair of inclined surfaces 43 is a section that is gripped or pressed by a worker when the sensor unit 20 is fixed to the sensor bracket 50 by the double-sided tape TP. Specifically, the worker grips the pair of inclined surfaces 43 and presses the sensor unit 20 toward the sensor bracket 50, and thereby the sensor unit 20 is fixed to the sensor bracket 50 via the double-sided tape TP. Accordingly, no excessive force is applied to the sensor main body 30, and the sensor main body 30 is not damaged.

As shown in FIG. 7, a hollow core metal accommodation portion 42a in which a cross-sectional shape is formed into a substantially circular shape is arranged in a substantially central section of the fixation base portion 42. Specifically, the core metal accommodation portion 42a is arranged directly below an axial center in the sensor accommodation portion 41, and is arranged over an entire longitudinal direction of the fixation base portion 42. That is, the core metal accommodation portion 42a is formed at the same time when the sensor holder 40 is extruded and molded, and the like.

As shown in FIG. 4 and FIGS. 6 to 8, inside the core metal accommodation portion 42a, a core metal member 44 is accommodated which is made of a wire or the like having a substantially circular cross-sectional shape and is set to a predetermined length. Here, the core metal member 44 can be inserted into the core metal accommodation portion 42a through a slight gap (not shown) with substantially no resistance. Accordingly, work of inserting the core metal member 44 to the core metal accommodation portion 42a in a [core metal insertion process] described later can be easily performed.

In addition, the core metal member 44 is arranged in the section of the curving portion CP (see FIG. 4) in the sensor unit 20 and holds the curving portion CP at a predetermined angle (approximately 90 degrees in the embodiment). That is, by bending and plastically deforming the core metal member 44, the fixation base portion 42 (the sensor holder 40) can be held in the curved state following the curved state of the curving portion CP, against a restoring force attempting to return the fixation base portion 42 straight.

Accordingly, work of fixing the sensor unit 20 to the sensor bracket 50 can be easily performed. In addition, the sensor unit 20 stuck with the double-sided tape TP is prevented from being peeled off from the sensor bracket 50 by the restoring force acting in the vicinity of the curving portion CP.

Here, a length dimension of the core metal member 44 is set to be smaller than a length dimension of the core metal accommodation portion 42a. Specifically, the core metal member 44 is inserted into the core metal accommodation portion 42a from an end portion of the fixation base portion 42, and as shown in FIG. 4, the length dimension of the core metal member 44 is set to an extent that the front end side thereof passes through the section of the curving portion CP from the end portion of the fixation base portion 42.

In this way, the core metal member 44 is not arranged in the whole section of the core metal accommodation portion 42a but arranged in the necessary section (the section of the curving portion CP), and thereby the length dimension of the core metal member 44 can be suppressed to a necessary minimum. Therefore, weight increase of the sensor unit 20 is suppressed, and the cost of the sensor unit 20 can be reduced.

Moreover, in FIG. 4, FIG. 6, FIG. 8, and FIGS. 10 to 13, the core metal member 44 is shaded in order to facilitate understanding of the length dimension of the core metal member 44 and a positional relationship with respect to the core metal accommodation portion 42a.

As shown in FIG. 6 and FIG. 8, a molded resin portion 45 is integrally arranged on a terminal of the sensor holder 40 (a front end side of the sensor main body 30). The molded resin portion 45 configures a terminal portion in the present invention and covers an end portion of the insulating tube 32 and end portions of the pair of electrodes 33 and 34. Furthermore, a separator SP made of an insulating body, one resistor R, and two swaging members SW are arranged inside the molded resin portion 45.

In this way, the molded resin portion 45 has a function of preventing each of the end portion of the insulating tube 32, the end portions of the pair of electrodes 33 and 34, the separator SP, the resistor R, and the pair of swaging members SW from being exposed to the outside, and protecting these constituent components.

Here, a long connection portion P1 and a short connection portion P2 are arranged at two end portions of the resistor R. Besides, by folding the long connection portion P1 at 180 degrees with respect to the short connection portion P2, the long connection portion P1 and the short connection portion P2 are respectively electrically connected to the conductive wires 36 of the pair of electrodes 33 and 34 by the pair of swaging members SW. In this way, the end portions of the pair of electrodes 33 and 34 are electrically connected to each other via the resistor R.

Moreover, the pair of swaging members SW is swaged by a swaging jig (not shown) such as electric pliers and the like, and thereby the resistor R is firmly and electrically connected to each conductive wire 36 of the pair of electrodes 33 and 34. In addition, each of the pair of swaging members SW is symmetrically arranged on two sides with the separator SP as a center, and are prevented from being short-circuited with each other in the section of the separator SP.

Besides, the molded resin portion 45 is formed by setting, in a mold (not shown), the end portion of the sensor holder 40 in which the separator SP, the resistor R and the like are assembled, and injecting a melted insulating rubber material or the like into the mold. That is, the constituent components such as the separator SP, the resistor R and the like are embedded inside the molded resin portion 45 by insert molding.

Here, the molded resin portion 45 is formed by the same insulating rubber material as the sensor holder 40 and has sufficient flexibility. However, for example, in order to more reliably protect the separator SP, the resistor R and the like embedded inside the molded resin portion 45, the molded resin portion 45 can also be formed by an insulating rubber material having a hardness higher than that of the sensor holder 40. Moreover, because the molded resin portion 45 is arranged at the end portion of the sensor holder 40, the molded resin portion 45 is not noticeable even if the material is different from that of the sensor holder 40. Therefore, deterioration of the appearance is suppressed.

Next, a manufacturing method of the sensor unit 20 formed as described above, particularly a procedure for mounting the sensor unit 20 on the sensor bracket 50 is described in detail with reference to the drawings.

Figure 9:
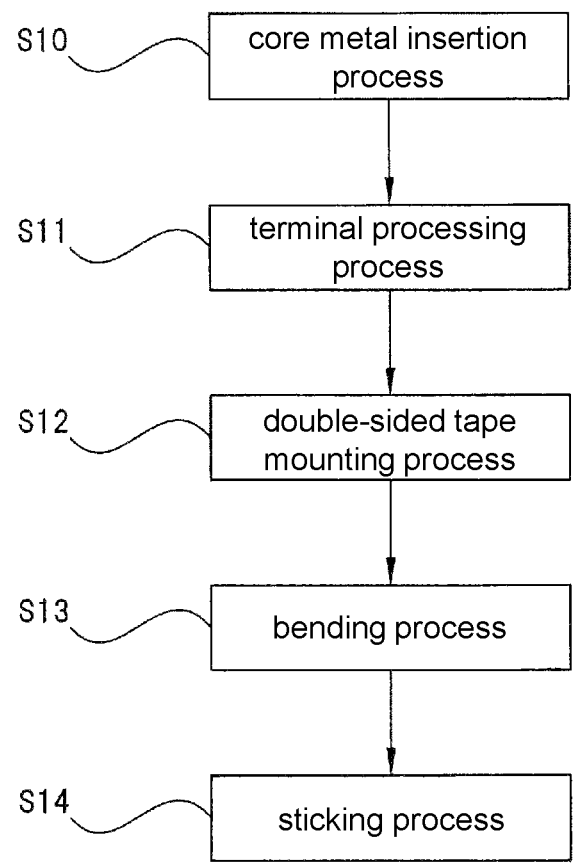
FIG. 9 is a flowchart showing a manufacturing procedure of the sensor unit.
Figure 10:
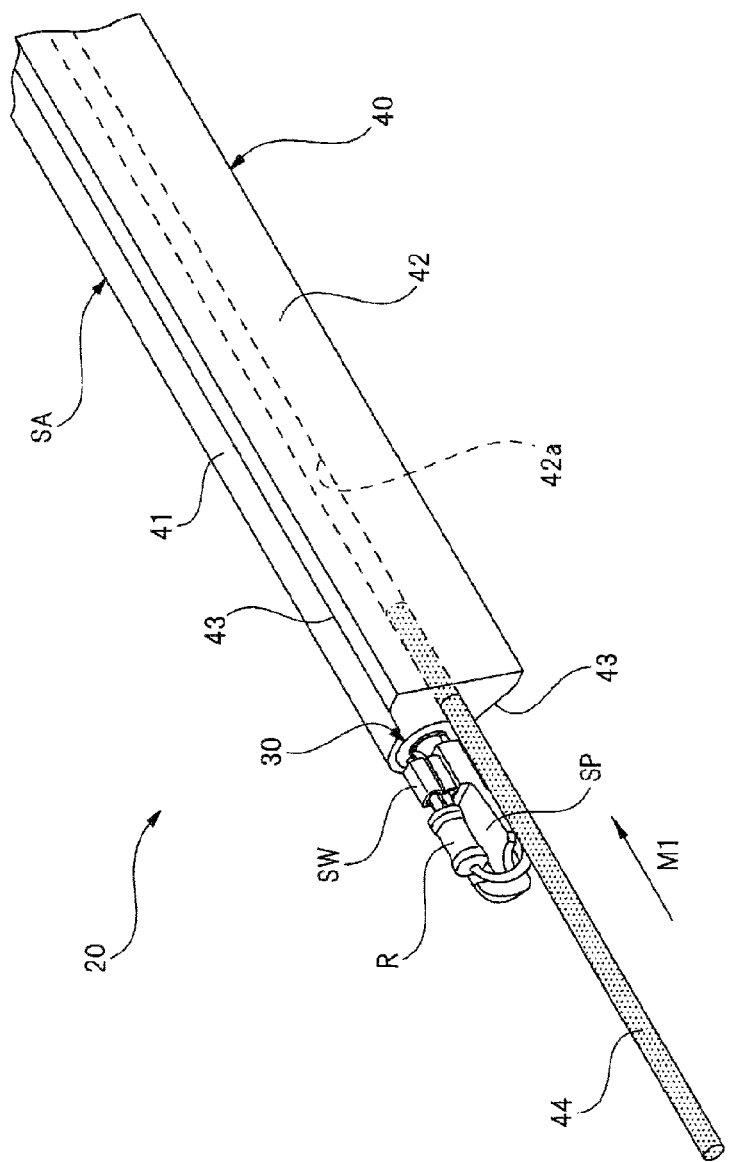
FIG. 10 is a perspective view illustrating a [core metal insertion process].
Figure 11:
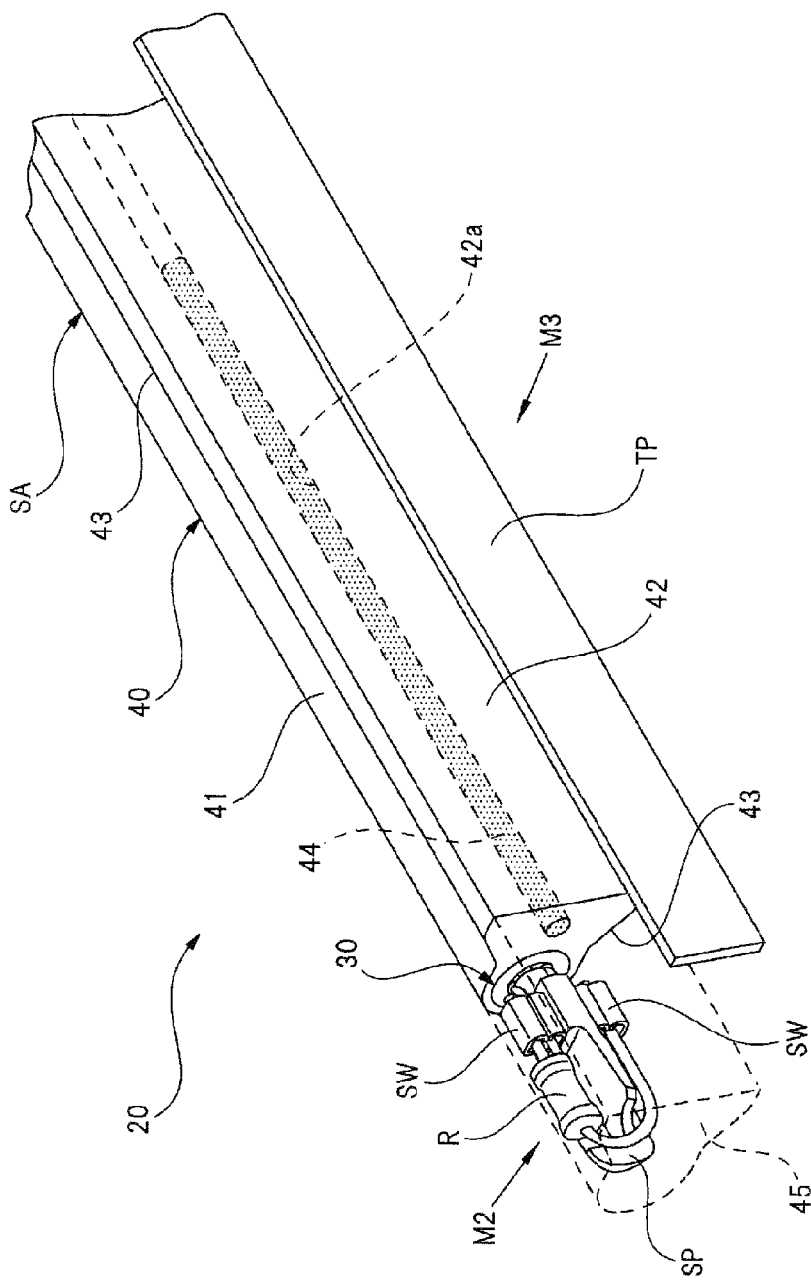
FIG. 11 is a perspective view illustrating a [terminal processing process] and a [double-sided tape mounting process].
Figure 12:
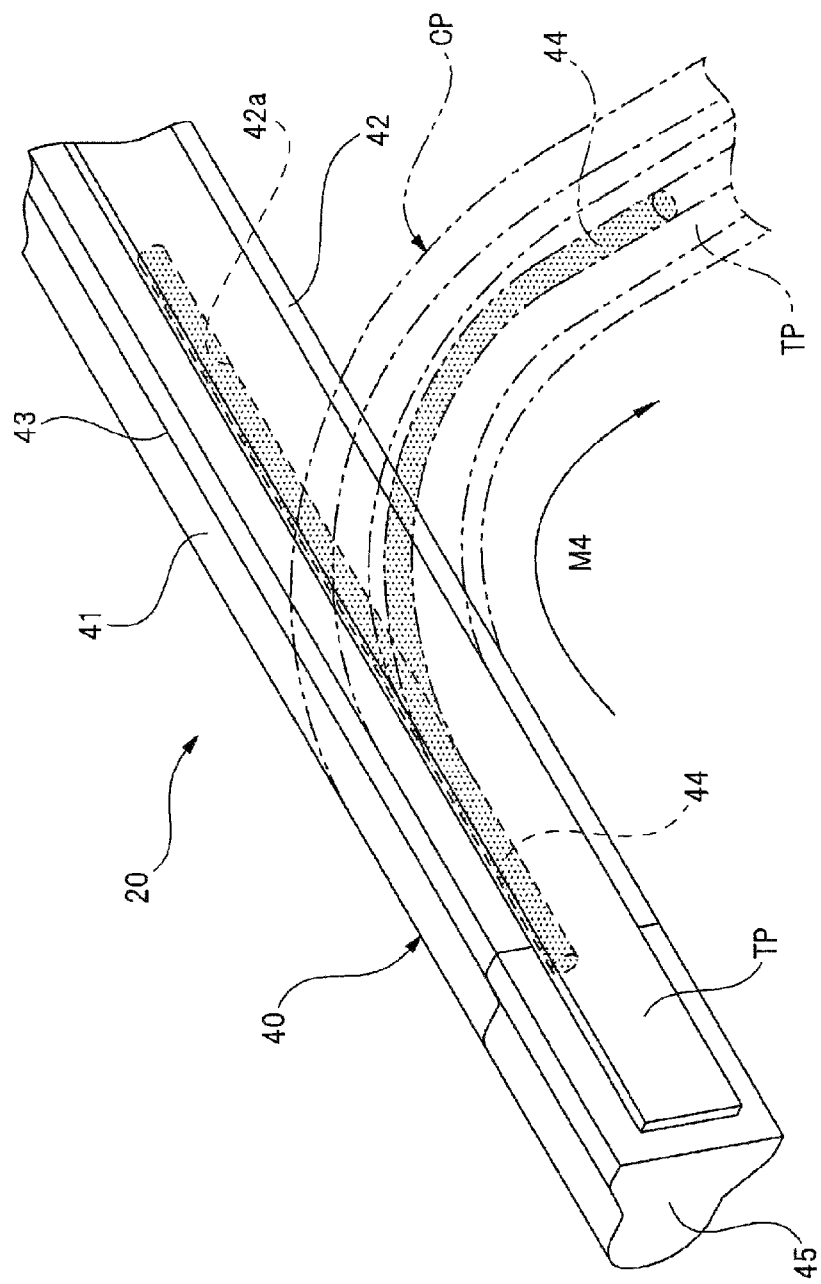
FIG. 12 is a perspective view illustrating a [bending process].
Figure 13:
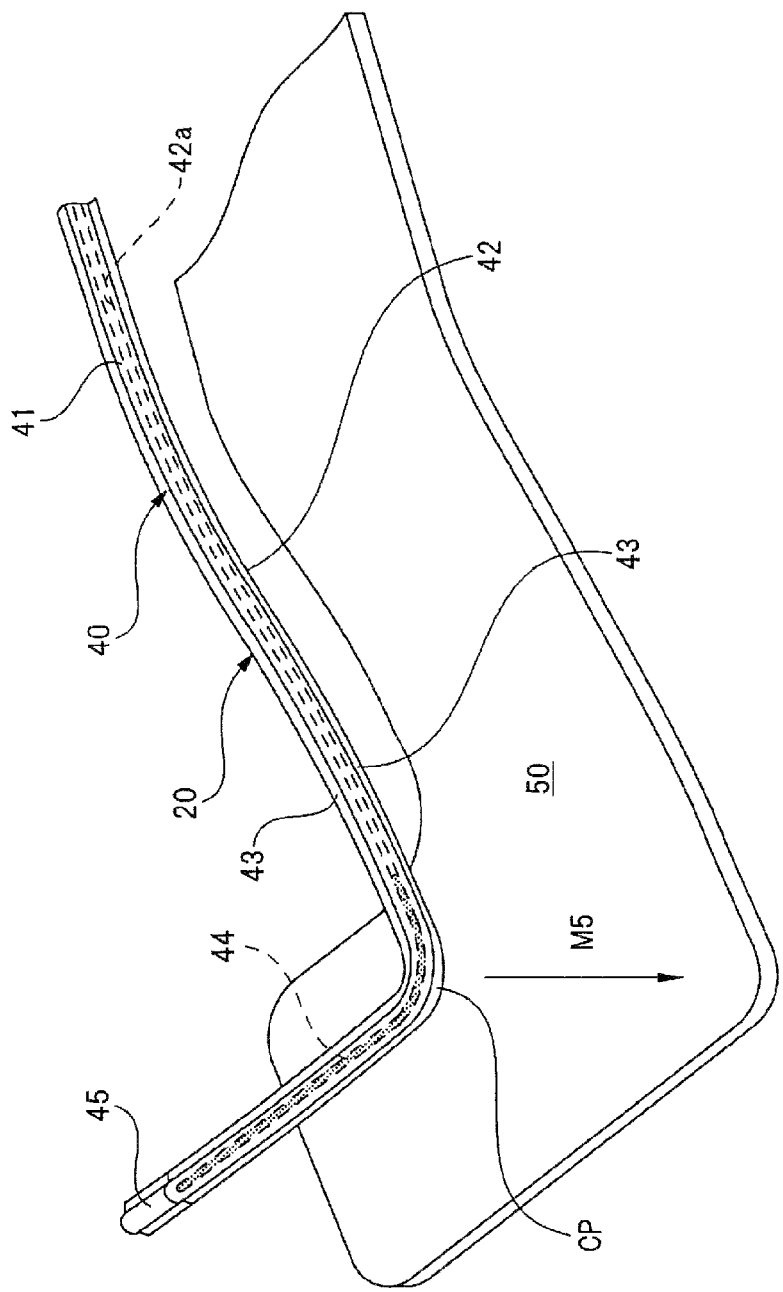
FIG. 13 is a perspective view illustrating a [sticking process].

FIG. 9 is a flowchart showing a manufacturing procedure of the sensor unit, FIG. 10 is a perspective view illustrating a [core metal insertion process], FIG. 11 is a perspective view illustrating a [terminal processing process] and a [double-sided tape mounting process], FIG. 12 is a perspective view illustrating a [bending process], and FIG. 13 is a perspective view illustrating a [sticking process].

In Embodiment 1, the sensor unit 20 is fixed to the sensor bracket 50 according to the procedure shown in FIG. 9.

[Core Metal Insertion Process]

First, the [core metal insertion process] is executed in Step S10. Specifically, as shown in FIG. 10, the core metal member 44 is prepared with the length dimension set to an extent that the front end side passes through the section of the curving portion CP (see FIG. 4) from the end portion of the fixation base portion 42. In addition, a sub-assembly SA assembled through another assembly process is prepared. Here, the sub-assembly SA refers to a state in which the sensor main body 30 is accommodated in the sensor accommodation portion 41, and the separator SP, the resistor R, and the swaging members SW are assembled in the end portion of the sensor main body 30.

After that, the core metal member 44 is inserted into the core metal accommodation portion 42a from the end portion of the fixation base portion 42 as shown by an arrow M1 in the diagram. At this time, a slight gap (not shown) is formed between the core metal member 44 and the core metal accommodation portion 42a, and thus the work of inserting the core metal member 44 to the core metal accommodation portion 42a can be easily performed. Then, the insertion work is continued until the whole core metal member 44 up to the base end side enters the core metal accommodation portion 42a. Moreover, the insertion work may be performed manually by a worker, or may be automatically performed by an automatic assembly device (not shown).

Accordingly, the core metal member 44 is inserted into a predetermined location extending along the longitudinal direction of the core metal accommodation portion 42a, that is, the section which later becomes the curving portion CP (see FIG. 4), and the [core metal insertion process] of Step S10 is completed.

[Terminal Processing Process]

Next, the [terminal processing process] is executed in Step S11. Specifically, as shown in FIG. 11, processing by which the molded resin portion 45 is formed in the terminal of the sensor holder 40 (the front end side of the sensor main body 30) is executed. That is, the end portion of the sub-assembly SA (the end portion on the side in which the resistor R and the like are assembled) is set in a mold (not shown), and melted insulating rubber material and the like are injected into the mold.

Then, the molded resin portion 45 is formed at the end portion of the fixation base portion 42 as shown by an arrow M2, and the sensor unit 20 is completed. Therefore, the constituent components such as the separator SP, the resistor R and the like are protected by the molded resin portion 45, and the core metal member 44 inserted into the core metal accommodation portion 42a is prevented from slipping off. Accordingly, the [terminal processing process] of Step S11 is completed.

[Double-Sided Tape Mounting Process]

Next, the [double-sided tape mounting process] is executed in Step S12. Specifically, as shown in FIG. 11, first, the double-sided tape TP is prepared which has the length dimension substantially equal to the length dimension of the sensor unit 20 including the molded resin portion 45. Next, a release paper (not shown) on one side of the double-sided tape TP is peeled off, and the double-sided tape TP is stuck to a back surface of the molded resin portion 45 and fixation base portion 42, that is, a facing surface facing the sensor bracket 50, as shown by an arrow M3.

At this time, the sensor unit 20 is still in a linear shape. Therefore, the sticking work of the double-sided tape TP can be easily performed. Moreover, the sticking work may be performed manually by the worker, or may be automatically performed by an automatic assembly device (not shown).

Accordingly, the double-sided tape TP is stuck to the back surface of the molded resin portion 45 and fixation base portion 42, and the [double-sided tape mounting process] of Step S12 is completed.

[Bending Process]

Next, the [bending process] is executed in Step S13. Specifically, the predetermined location extending along the longitudinal direction of the sensor unit 20 is bent as shown by an arrow M4 in FIG. 12. At this time, the worker grips the pair of inclined surfaces 43 of the fixation base portion 42, and bends the section of the fixation base portion 42, into which the core metal member 44 is inserted, so as to be approximately 90 degrees following the curved shape of the sensor bracket 50 (see FIG. 4). Moreover, the bending direction is the direction orthogonal to the sticking direction of the double-sided tape TP (the direction of the arrow M3 in FIG. 11).

Accordingly, the curving portion CP is formed at a location with a predetermined distance from the end portion of the fixation base portion 42 as shown by two-dot chain lines in FIG. 12, and the [bending process] of Step S13 is completed.

Here, the curving portion CP can be formed at any section of the fixation base portion 42 where the core metal member 44 is inserted, and thus the curving portion CP can be adjusted when the section where the curving portion CP is arranged is shifted, or the position where the curving portion CP is arranged can be changed in order to correspond to a sensor bracket having another shape. Therefore, the versatility of the sensor unit 20 is improved. In addition, the versatility of the sensor unit 20 can be further improved by preparing a core metal member set to another length.

Furthermore, the core metal member 44 is accommodated, via the slight gap, in the core metal accommodation portion 42a formed in advance in the fixation base portion 42. Therefore, the fixation base portion 42 does not bulge so much to the extent that the shape of the core metal member 44 can be seen and determined from the outside. Therefore, the deterioration of appearance as before can be suppressed.

[Sticking Process]

After the [bending process], the [sticking process] is executed in Step S14. Here, the [sticking process] configures the sensor holder fixation process in the present invention. Specifically, in the [sticking process], the release paper (not shown) on the other side of the double-sided tape TP (see FIG. 12) is peeled off, and a double-sided tape TP side (a lower side in the diagram) of the sensor unit 20 is placed so as to face a predetermined position of the sensor bracket 50 (a position for sticking the sensor unit 20) as shown by an arrow M5 in FIG. 13.

After that, the worker grips the pair of inclined surfaces 43 and presses the sensor unit 20 (the sensor holder 40) toward the sensor bracket 50. At this time, the entire longitudinal direction of the sensor unit 20 is sequentially pressed.

Thereby, the sensor unit 20 (the sensor holder 40) bent through the [bending process] is firmly fixed to the sensor bracket 50 via the double-sided tape TP. Accordingly, the [sticking process] of Step S14 is completed.

As described above in detail, according to Embodiment 1, the sensor unit manufacturing method includes: the [core metal insertion process] of inserting the core metal member 44 having a length dimension smaller than the length dimension of the core metal accommodation portion 42a into the predetermined location extending along the longitudinal direction of the core metal accommodation portion 42a (the section of the curving portion CP); and the [bending process] of bending the section (the section of the curving portion CP) of the fixation base portion 42, into which the core metal member 44 is inserted, following the curved shape of the sensor bracket 50.

Accordingly, the appearance of the section (the section of the curving portion CP) of the fixation base portion 42 into which the core metal member 44 is inserted can be improved. In addition, by increasing the length dimension of the core metal member 44 to be accommodated in the core metal accommodation portion 42a, the position where the curving portion CP is formed can be shifted by a predetermined amount in the longitudinal direction of the fixation base portion 42. Therefore, the position of the curving portion CP can be adjusted, and further the yield and the versatility can be improved.

In addition, according to Embodiment 1, after the [bending process], the [sticking process] is performed in which the sensor holder 40 (the sensor unit 20) bent through the [bending process] is fixed to the sensor bracket 50. Accordingly, the sensor unit 20 can be precisely and easily fixed to the sensor bracket 50.

Furthermore, according to Embodiment 1, in the [core metal insertion process], the core metal member 44 is inserted into the core metal accommodation portion 42a from the end portion of the fixation base portion 42. Accordingly, the core metal member 44 can be easily accommodated in the core metal accommodation portion 42a, and the worker can easily grasp the insertion position of the core metal member 44 with respect to the core metal accommodation portion 42a. Therefore, workability can be improved.

In addition, according to Embodiment 1, the [terminal processing process] of forming the molded resin portion 45 at the end portion of the fixation base portion 42 is performed between the [core metal insertion process] and the [bending process]. Accordingly, the constituent components such as the separator SP, the resistor R and the like can be protected by the molded resin portion 45, and the core metal member 44 inserted into the core metal accommodation portion 42a can be prevented from slipping off. Therefore, the [bending process] thereafter can be easily performed.

Next, Embodiments 2 to 5 (the other four types) of the present invention are described in detail with reference to the drawings. Moreover, the sections having the same functions as the sections in Embodiment 1 described above are designated by the same symbols, and detailed description thereof is omitted.

Embodiment 2

Figure 14:
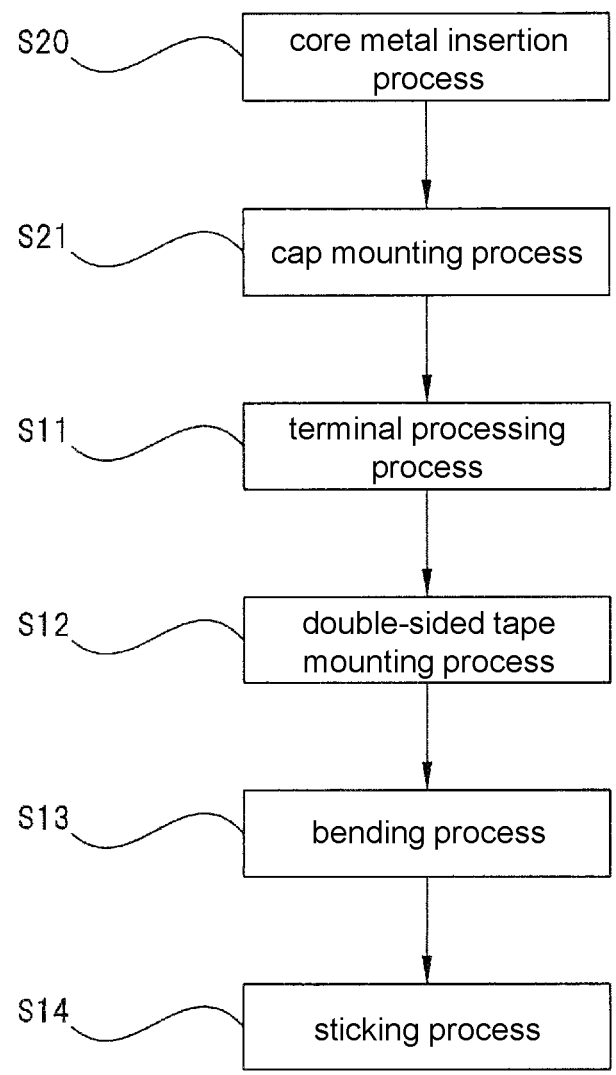
FIG. 14 is a flowchart showing a manufacturing procedure of a sensor unit of Embodiment 2.
Figure 15:
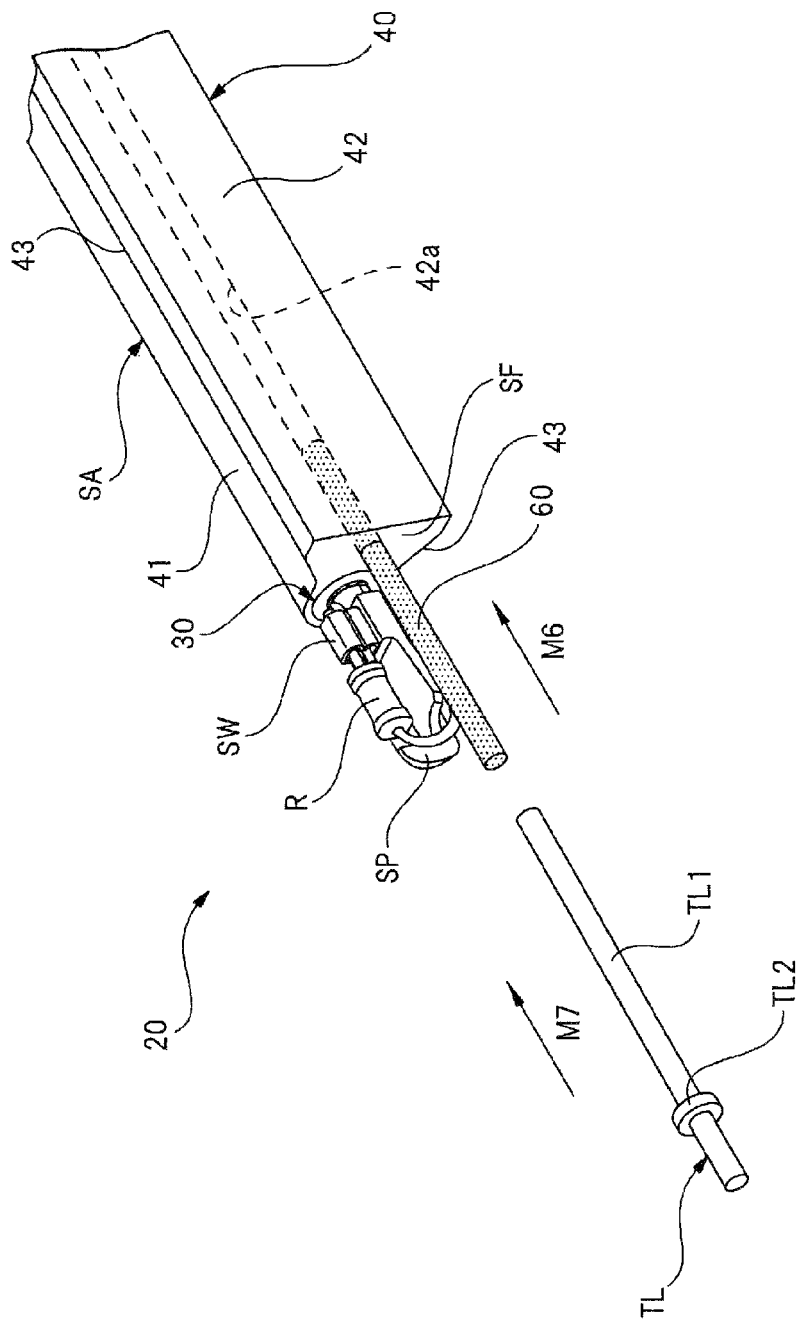
FIG. 15 is a perspective view illustrating a [core metal insertion process] of Embodiment 2.
Figure 16:
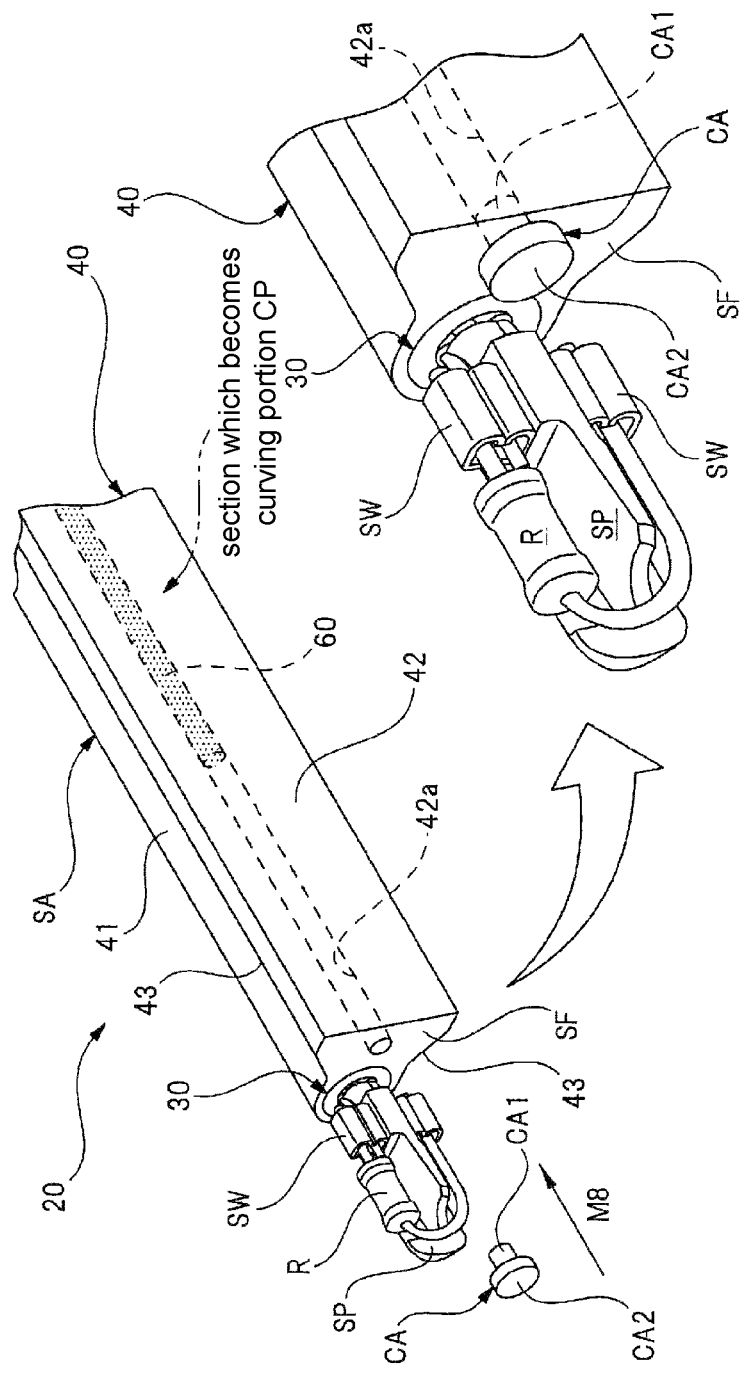
FIG. 16 is a perspective view illustrating a [cap mounting process].

FIG. 14 is a flowchart showing a manufacturing procedure of a sensor unit of Embodiment 2, FIG. 15 is a perspective view illustrating a [core metal insertion process] of Embodiment 2, and FIG. 16 is a perspective view illustrating a [cap mounting process].

As shown in FIG. 14, Embodiment 2 is different from Embodiment 1 (see FIG. 9) in that the [cap mounting process] is performed between the [core metal insertion process] and the [terminal processing process]. In addition, work content of the [core metal insertion process] is also different.

The [core metal insertion process] and the [cap mounting process] of Embodiment 2 are specifically described below.

[Core Metal Insertion Process]

In the [core metal insertion process] in Step S20 of FIG. 14, as shown in FIG. 15, a core metal member 60 which has a length dimension smaller than that of the core metal member 44 (see FIG. 10) in Embodiment 1 is used. Then, an insertion jig TL is used in the work of inserting the core metal member 60 into the core metal accommodation portion 42a. Here, the insertion jig TL includes a main body portion TL1 having a diameter dimension equal to or less than the diameter dimension of the core metal member 60, and a flange portion TL2 which decides the position to inset the core metal member 60 from the end portion of the core metal accommodation portion 42a.

Then, as shown by an arrow M6 in the diagram, the core metal member 60 is inserted into the core metal accommodation portion 42a from the end portion of the fixation base portion 42. Next, as shown by an arrow M7 in the diagram, the main body portion TL1 of the insertion jig TL is inserted into the core metal accommodation portion 42a. Accordingly, the core metal member 60 shorter than the core metal member 44 of Embodiment 1 can be inserted into the section which becomes the curving portion CP (see FIG. 4) similar to that of Embodiment 1. At this time, the flange portion TL2 of the insertion jig TL is abutted against an end surface SF of the fixation base portion 42.

Accordingly, the core metal member 60 is precisely accommodated in the predetermined location extending along the longitudinal direction of the core metal accommodation portion 42a, that is, the section which later becomes the curving portion CP, and the [core metal insertion process] of Step S20 is completed. Moreover, in Embodiment 2, the insertion work may also be performed manually by the worker, or may also be automatically performed by an automatic assembly device (not shown).

[Cap Mounting Process]

In the [cap mounting process] in Step S21 of FIG. 14, a cap (a cap member) CA is mounted on the end portion of the core metal accommodation portion 42a as shown by an arrow M8 in FIG. 16. The process is performed to prevent the melted resin forming the molded resin portion 45 (see FIG. 11) from flowing into a space section on the end portion side of the core metal accommodation portion 42a (a section where the core metal member 60 does not exist), in the [terminal processing process] in Step S11 performed after the [cap mounting process] of Step S21.

If the melted resin flows into the core metal accommodation portion 42a, the core metal member 60 which is shorter and more lightweight than the core metal member 44 (see FIG. 10) of Embodiment 1 may move inside the core metal accommodation portion 42a. In other words, by arranging the cap CA, the "positional deviation" of the core metal member 60 in the core metal accommodation portion 42a is eliminated, and the yield is improved.

Here, the cap CA includes an insertion main body CA1 which is formed by a resin material such as plastic or the like and is formed into a substantially cylindrical shape, and a head portion CA2 abutted against the end surface SF of the fixation base portion 42. Besides, a diameter dimension of the insertion main body CA1 is set to a diameter dimension slightly larger than the diameter dimension of the core metal accommodation portion 42a, and the insertion main body CA1 is inserted into the core metal accommodation portion 42a by press fitting. Therefore, the cap CA does not fall off from the core metal accommodation portion 42a when the sensor unit 20 is assembled. Accordingly, the [cap mounting process] of Step S21 is completed.

In this way, by mounting the cap CA on the end portion of the core metal accommodation portion 42a, the core metal member 60 can be reliably held in the predetermined location of the core metal accommodation portion 42a, that is, the section which later becomes the curving portion CP, in the [terminal processing process] performed in Step S11 thereafter. Moreover, the cap CA is embedded inside the molded resin portion 45 (see FIG. 11) after the [terminal processing process].

In Embodiment 2 formed as described above, the same operation effect as that of Embodiment 1 described above can also be achieved. In addition, in Embodiment 2, the core metal member 60 made of a metal material such as a wire or the like can be shortened to reduce the weight, and further the entire sensor unit 20 can be more lightweight.

Embodiment 3

Figure 17:
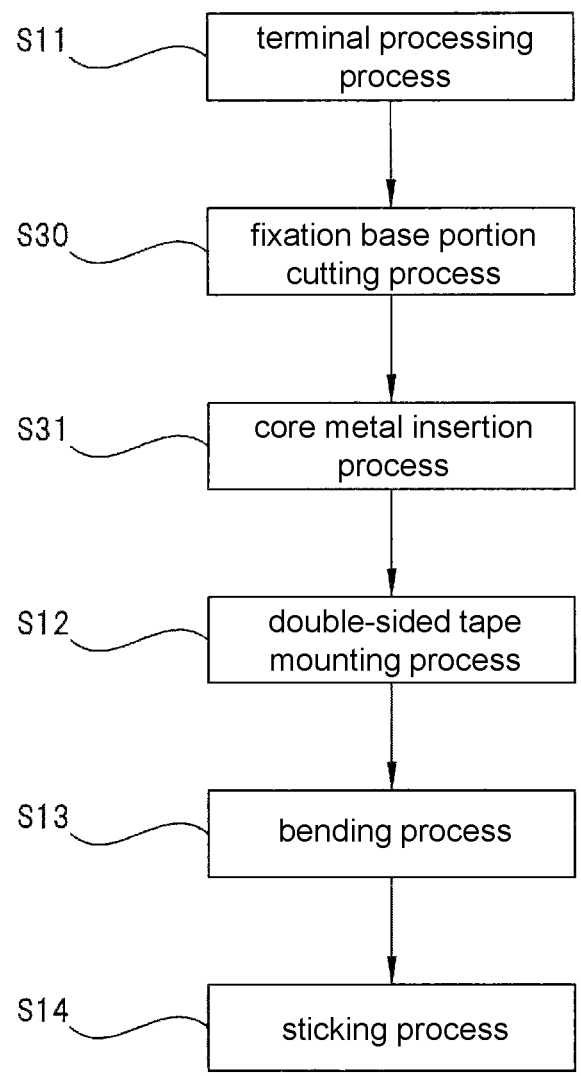
FIG. 17 is a flowchart showing a manufacturing procedure of a sensor unit of Embodiment 3.
Figure 18:
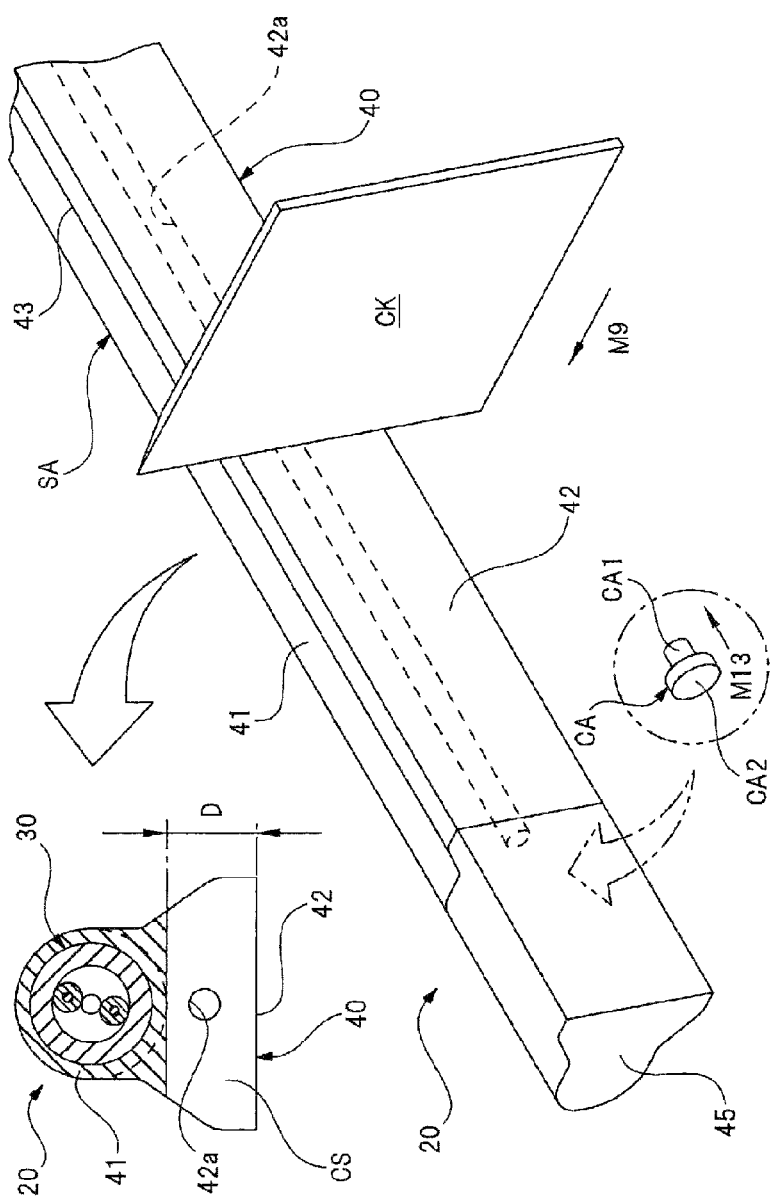
FIG. 18 is a perspective view illustrating a [fixation base portion cutting process].
Figure 19:
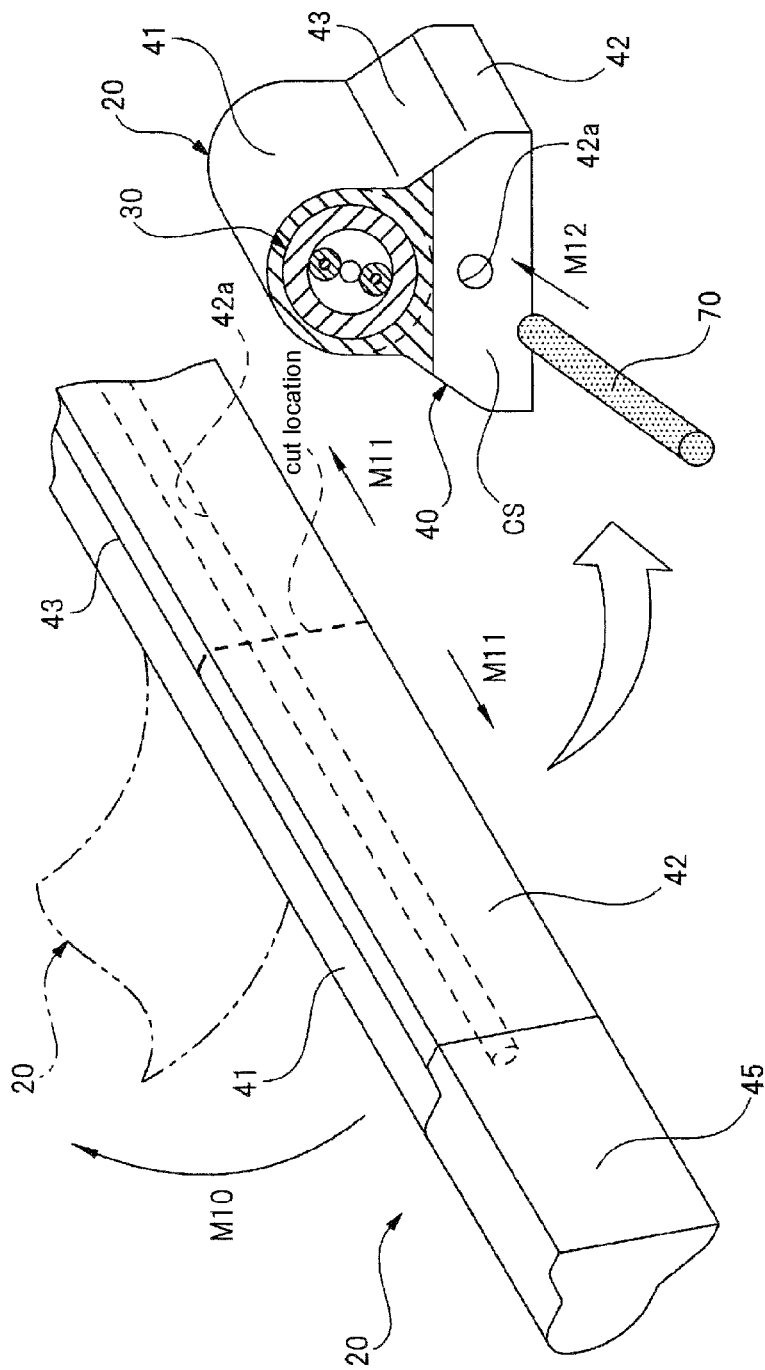
FIG. 19 is a perspective view illustrating a [core metal insertion process] of Embodiment 3.

FIG. 17 is a flowchart showing a manufacturing procedure of a sensor unit of Embodiment 3, FIG. 18 is a perspective view illustrating a [fixation base portion cutting process], and FIG. 19 is a perspective view illustrating a [core metal insertion process] in Embodiment 3.

As shown in FIG. 17, Embodiment 3 is different from Embodiment 1 (see FIG. 9) in that a [fixation base portion cutting process] is performed before the [core metal insertion process]. In addition, work content of the [core metal insertion process] is also different. Furthermore, it is also different in that the [terminal processing process] is performed before the [fixation base portion cutting process].

The [fixation base portion cutting process] and the [core metal insertion process] of Embodiment 3 are specifically described below.

[Fixation Base Portion Cutting Process]

In the [fixation base portion cutting process] in Step S30 of FIG. 17, as shown in FIG. 18, processing of cutting the predetermined location of the fixation base portion 42, that is, the section which later becomes the curving portion CP (see FIG. 4) as shown by an arrow M9 is performed on the sub-assembly SA in the state that the molded resin portion 45 is arranged in advanced in Step S11 (however, the core metal member 44 is not inserted into the core metal accommodation portion 42a).

Specifically, a cutting blade CK such as a cutting knife or the like is used to make a cut at the predetermined location extending along the longitudinal direction of the fixation base portion 42 from a direction orthogonal to the longitudinal direction of the fixation base portion 42 (the sensor unit 20). At this time, a cut depth dimension D into the fixation base portion 42 is set to a cut depth dimension at which no cut is made in the sensor accommodation portion 41.

Then, as shown in FIG. 18 and FIG. 19, a cut surface CS is formed at the section of the fixation base portion 42 which becomes the curving portion CP. The cut surface CS may be exposed to the outside by bending the section connected to the sensor accommodation portion 41. Accordingly, the [fixation base portion cutting process] of Step S30 is completed.

[Core Metal Insertion Process]

In the [core metal insertion process] in Step S31 of FIG. 17, as shown in FIG. 19, a core metal member 70 which has a length dimension smaller than that of the core metal member 44 of Embodiment 1 (see FIG. 10) is used. In addition, the core metal member 70 is inserted into the core metal accommodation portion 42a from the cut location of the fixation base portion 42, that is, the cut surface CS.

Specifically, in order to expose the cut surface CS of the fixation base portion 42 to the outside, the section connected to the sensor accommodation portion 41 is bent as shown by an arrow M10. Then, as shown by arrows M11, the cut location of the fixation base portion 42 is opened, and the cut surface CS of the fixation base portion 42 is exposed to the outside. Accordingly, in the section of the cut surface CS, the core metal accommodation portion 42a is opened.

Next, as shown by an arrow M12, the core metal member 70 is inserted into the core metal accommodation portion 42a from the cut location of the fixation base portion 42, that is, the cut surface CS. Accordingly, the core metal member 70 shorter than the core metal member 44 of Embodiment 1 can be inserted into the section which becomes the curving portion CP (see FIG. 4) similar to that of Embodiment 1.

Accordingly, the core metal member 70 is precisely accommodated in the predetermined location extending along the longitudinal direction of the core metal accommodation portion 42a, that is, the section which later becomes the curving portion CP, and the [core metal insertion process] of Step S31 is completed. Moreover, after the core metal member 70 is inserted into the core metal accommodation portion 42a, an adhesive agent or the like (not shown) may be coated on the cut surface CS. Accordingly, the core metal accommodation portion 42a is sealed, and the core metal member 70 is prevented from rusting.

In Embodiment 3 formed as described above, the same operation effect as that of Embodiment 1 described above can also be achieved. In addition, in Embodiment 3, the core metal member 70 made of a metal material such as a wire or the like can be shortened to reduce the weight, and further the entire sensor unit 20 can be more lightweight.

Embodiment 4

Figure 20:
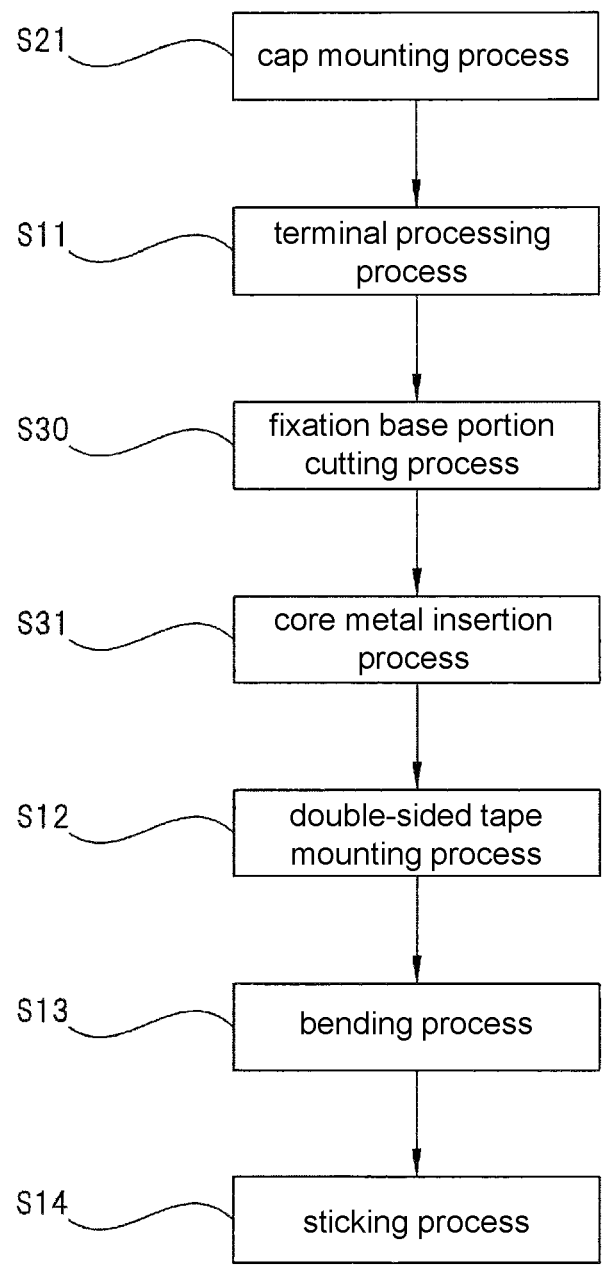
FIG. 20 is a flowchart showing a manufacturing procedure of a sensor unit of Embodiment 4.

FIG. 20 is a flowchart showing a manufacturing procedure of a sensor unit of Embodiment 4.

As shown in FIG. 20, Embodiment 4 is different from Embodiment 3 (see FIG. 17) in that the [cap mounting process] is performed before the [terminal processing process]. Specifically, in the [cap mounting process] of Embodiment 4, the processing the same as the [cap mounting process] of Embodiment 2 is performed. That is, as shown by the two-dot chain line circle and the two-dot chain line void arrow of FIG. 18, the cap CA having the insertion main body CA1 and the head portion CA2 is mounted on the end portion of the core metal accommodation portion 42a following an arrow M13.

In Embodiment 4 formed as described above, the same operation effect as that of Embodiment 3 described above can also be achieved. In addition, in Embodiment 4, the melted resin can be reliably prevented from flowing into the core metal accommodation portion 42a in the [terminal processing process] of Step S11.

Embodiment 5

Figure 21:
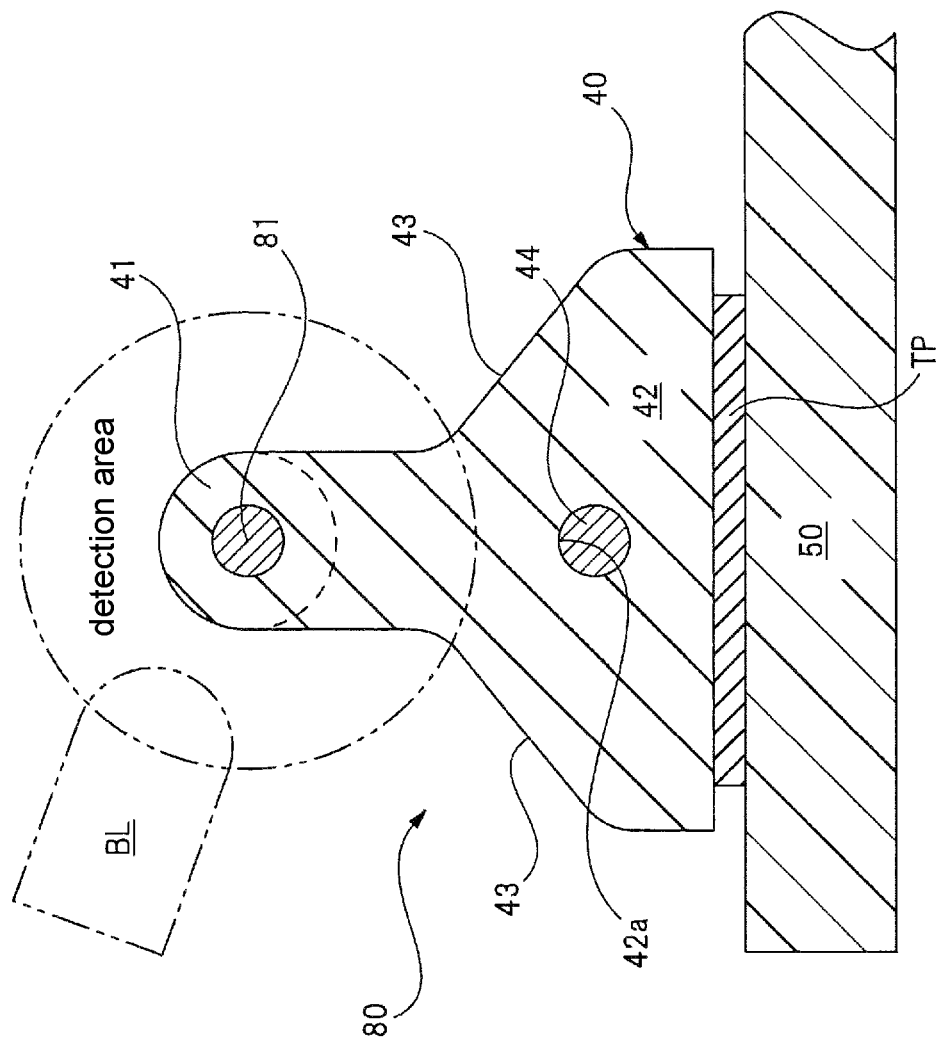
FIG. 21 is a cross-sectional view corresponding to FIG. 7 and shows a sensor unit of Embodiment 5.

FIG. 21 is a cross-sectional view corresponding to FIG. 7 and shows a sensor unit of Embodiment 5.

As shown in FIG. 21, first, a sensor unit 80 of Embodiment 5 is different from the sensor unit 20 of Embodiment 1 (see FIG. 7) in terms of the shape of the sensor holder 40. Specifically, the sensor accommodation portion 41 side (an upper side in the diagram) of the sensor holder 40 is formed in a more tapered shape as compared with Embodiment 1. In addition, it is also different in that the sensor holder 40 is formed by a rubber material having electrical conductivity. Furthermore, a detection method of a sensor main body 81 held in the sensor accommodation portion 41 is different.

Specifically, the sensor main body 81 being cable-shaped is a non-contact type proximity sensor which makes the controller 13b (see FIG. 1 and FIG. 2) detect that the block BL such as a human body and the like is in close proximity. The sensor main body 81 consists of electrodes, and when the block BL such as a human body and the like enters a detection area shown by the two-dot chain line circle in FIG. 21, a change in the electric signal showing that the block BL approaches the sensor unit 80 is output to the controller 13b.

Here, the sensor main body 81 comes into a state in which a weak electric signal flows from the controller 13b. Then, when the block BL approaches the sensor main body 81 in this state, capacitance between the block BL and the sensor main body 81 changes, and the electric signal flowing in the sensor main body 81 rises.

The controller 13b is made to detect the change of the electric signal, and thereby the controller 13b detects that the block BL approaches the sensor unit 80. That is, the sensor main body 81 formed by electrodes is a capacitance sensor. Moreover, the sensor main body 81 (the electrode) is formed by, for example, a conductive wire (a wiring cord) in which a plurality of copper wires are bundled.

In Embodiment 5 formed as described above, the same operation effect as that of Embodiment 1 described above can also be achieved. In addition, in Embodiment 5, because the sensor main body 81 is a non-contact type proximity sensor, the contact of the block BL can be prevented from occurring, and the reliability can be further improved. In addition, by adopting the non-contact type sensor main body 81, the sensor unit 80 can be smaller and more lightweight.

Moreover, in Embodiment 5, the manufacturing procedure of the sensor unit shown in Embodiments 2 to 4 described above can also be applied.

It is clear that the present invention is not limited to each of the embodiments described above, and various modifications can be made without departing from the gist thereof. For example, in Embodiments 1 to 4 described above, a pair of electrodes 33 and 34 is spirally fixed inside the insulating tube 32, but the present invention is not limited hereto, and four electrodes, six electrodes, or the like may be arranged spirally or in parallel according to a thickness of the electrode, a required detection performance, and the like.

Furthermore, in each of the embodiments described above, the case in which the sensor units 20 and 80 are fixed to the tail gate 12 of the vehicle 10 is shown, but the present invention is not limited hereto. The sensor unit may also be fixed to a glass hatch or a sunroof of the vehicle, and even a sliding door on a lateral side of the vehicle, and can be applied not only to the vehicle 10, but also to an automatic door device for opening and closing a doorway of a building and the like.

In addition, the material, the shape, the dimension, the number, the installation location, and the like of each constituent element in each of the embodiments described above are not limited to each of the embodiments and are arbitrary as long as the present invention can be achieved.

What is claimed is:

1. A sensor unit manufacturing method, which manufactures a sensor unit comprising:
a sensor main body which is cable-shaped and detects proximity or contact of a block; and
a sensor holder which holds the sensor main body and is elastically deformed by application of an external force, wherein
the sensor holder comprises:
a sensor accommodation portion in which the sensor main body is accommodated inside;
a fixation base portion which is integrally arranged with the sensor accommodation portion in order to fix the sensor accommodation portion to a fixation object; and
a core metal accommodation portion which is arranged in the fixation base portion and in which a core metal member is accommodated inside, and
the sensor unit manufacturing method comprises:
a core metal insertion process of inserting the core metal member having a length dimension smaller than a length dimension of the core metal accommodation portion into a predetermined location extending along a longitudinal direction of the core metal accommodation portion; and
a bending process of bending the section of the fixation base portion, into which the core metal member is inserted, following a curved shape of the fixation object.

2. The sensor unit manufacturing method according to claim 1, wherein
a sensor holder fixation process of fixing the sensor holder which is bent through the bending process to the fixation object is performed after the bending process.

3. The sensor unit manufacturing method according to claim 1, wherein
the core metal member is inserted into the core metal accommodation portion from an end portion of the fixation base portion in the core metal insertion process.

4. The sensor unit manufacturing method according to claim 3, wherein
a terminal processing process of forming a terminal portion at the end portion of the fixation base portion is performed between the core metal insertion process and the bending process.

5. The sensor unit manufacturing method according to claim 4, wherein
a cap mounting process of mounting a cap member on an end portion of the core metal accommodation portion is performed between the core metal insertion process and the terminal processing process.

6. The sensor unit manufacturing method according to claim 1, wherein
a fixation base portion cutting process of cutting a predetermined location extending along a longitudinal direction of the fixation base portion in a direction intersecting the longitudinal direction of the fixation base portion is performed before the core metal insertion process, and the core metal member is inserted into the core metal accommodation portion from a cut location of the fixation base portion in the core metal insertion process thereafter.

7. The sensor unit manufacturing method according to claim 6, wherein
a terminal processing process of forming a terminal portion at an end portion of the fixation base portion is performed before the fixation base portion cutting process.

8. The sensor unit manufacturing method according to claim 7, wherein
a cap mounting process of mounting a cap member on an end portion of the core metal accommodation portion is performed before the terminal processing process.

9. The sensor unit manufacturing method according to claim 2, wherein
the core metal member is inserted into the core metal accommodation portion from an end portion of the fixation base portion in the core metal insertion process.

10. The sensor unit manufacturing method according to claim 9, wherein
a terminal processing process of forming a terminal portion at the end portion of the fixation base portion is performed between the core metal insertion process and the bending process.

11. The sensor unit manufacturing method according to claim 10, wherein
a cap mounting process of mounting a cap member on an end portion of the core metal accommodation portion is performed between the core metal insertion process and the terminal processing process.

12. The sensor unit manufacturing method according to claim 2, wherein
a fixation base portion cutting process of cutting a predetermined location extending along a longitudinal direction of the fixation base portion in a direction intersecting the longitudinal direction of the fixation base portion is performed before the core metal insertion process, and
the core metal member is inserted into the core metal accommodation portion from a cut location of the fixation base portion in the core metal insertion process thereafter.

13. The sensor unit manufacturing method according to claim 12, wherein
a terminal processing process of forming a terminal portion at an end portion of the fixation base portion is performed before the fixation base portion cutting process.

14. The sensor unit manufacturing method according to claim 13, wherein
a cap mounting process of mounting a cap member on an end portion of the core metal accommodation portion is performed before the terminal processing process.

* * * * *